United States Patent
Yang

(10) Patent No.: US 10,666,246 B2
(45) Date of Patent: May 26, 2020

(54) DRIVING CIRCUIT AND A DESATURATION CIRCUIT OF A POWER CIRCUIT

(71) Applicant: Delta Electronics, Inc., Taoyuan (TW)

(72) Inventor: Chang-Jing Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/403,321

(22) Filed: May 3, 2019

(65) Prior Publication Data
US 2019/0260373 A1 Aug. 22, 2019

Related U.S. Application Data

(63) Continuation-in-part of application No. 15/495,009, filed on Apr. 24, 2017, now Pat. No. 10,326,438.
(Continued)

(51) Int. Cl.
*H03K 17/0812* (2006.01)
*H02M 3/07* (2006.01)
*H03K 3/3565* (2006.01)

(52) U.S. Cl.
CPC ........ *H03K 17/08122* (2013.01); *H02M 3/07* (2013.01); *H03K 3/3565* (2013.01);
(Continued)

(58) Field of Classification Search
CPC .............. H03K 17/08; H03K 17/0812; H03K 17/08122; H03K 17/08126;
(Continued)

(56) References Cited

U.S. PATENT DOCUMENTS

| 5,648,735 A | 7/1997 | Bowers et al. |
| 5,818,209 A | 10/1998 | Masini et al. |

(Continued)

FOREIGN PATENT DOCUMENTS

| CN | 102969889 A | 3/2013 |
| TW | 201121215 A | 6/2011 |

(Continued)

OTHER PUBLICATIONS

Taiwanese Office Actions in corresponding TW application No. 108126449 dated Dec. 30, 2019; pp. 1-9.
(Continued)

*Primary Examiner* — Tomi Skibinski
(74) *Attorney, Agent, or Firm* — Muncy, Geissler, Olds & Lowe, P.C.

(57) ABSTRACT

A power circuit includes a power transistor and a driving circuit. The power transistor draws a power current from a loading node according to a voltage of a driving node and stops drawing the power current according to an over-current signal. The driving circuit includes a high-side transistor, a low-side transistor, a charge pump, a pre-driver, and a desaturation circuit. The high-side transistor provides a supply voltage to the driving node according to a high-side voltage of a high-side node. The low-side transistor couples the driving node to the ground according to a first internal signal. The charge pump generates a high-side voltage that exceeds the supply voltage according to the first internal signal. The pre-driver generates the first internal signal according to a control signal. The desaturation circuit determines that the power current exceeds a threshold to generate the over-current signal.

20 Claims, 16 Drawing Sheets

Related U.S. Application Data which is a continuation-in-part of application No. 15/395,738, filed on Dec. 30, 2016, now Pat. No. 9,906,221.

(52) U.S. Cl.
CPC .............. *H03K 2217/0063* (2013.01); *H03K 2217/0072* (2013.01); *H03K 2217/0081* (2013.01)

(58) Field of Classification Search
CPC ......... H03K 17/08128; H03K 17/0814; H03K 17/08142; H03K 17/08146; H03K 17/08148; H03K 17/082; H03K 17/0822; H03K 17/0826; H03K 17/0828
USPC ........ 327/108–112, 427, 434, 437, 378–391; 326/82, 83, 87
See application file for complete search history.

(56) References Cited

U.S. PATENT DOCUMENTS

| | | | |
|---|---|---|---|
| 6,515,461 B2 | 2/2003 | Akiyama et al. | |
| 6,885,225 B2 | 4/2005 | Ohmichi et al. | |
| 7,606,085 B2 | 10/2009 | Wada et al. | |
| 7,986,180 B2 | 7/2011 | Lee et al. | |
| 9,525,413 B2 | 12/2016 | Roberts et al. | |
| 9,780,773 B2 | 10/2017 | Kawata et al. | |
| 9,906,221 B1 | 2/2018 | Yang | |
| 10,014,853 B1 | 7/2018 | Yang | |
| 10,103,725 B2 * | 10/2018 | Yang | H03K 17/063 |
| 2008/0157830 A1 | 7/2008 | Kume | |
| 2009/0039950 A1 | 2/2009 | Takeuchi | |
| 2012/0049899 A1 | 3/2012 | Natani et al. | |
| 2013/0307593 A1 * | 11/2013 | Fukuta | H03K 17/30 327/109 |

FOREIGN PATENT DOCUMENTS

| | | |
|---|---|---|
| TW | 201823905 A | 7/2018 |
| TW | I637595 B | 10/2018 |
| TW | 201909560 A | 3/2019 |

OTHER PUBLICATIONS

Taiwanese Office Actions in corresponding TW application No. 108129940, dated Feb. 3, 2020; pp. 1-7.

* cited by examiner

DRIVING CIRCUIT AND A DESATURATION CIRCUIT OF A POWER CIRCUIT

CROSS REFERENCE TO RELATED APPLICATIONS

This application is a Continuation-In-Part of pending U.S. patent application Ser. No. 15/495,009, filed Apr. 24, 2017 and entitled "A DRIVING CIRCUIT OF A POWER CIRCUIT AND A REGULATOR", which is a Continuation-In-Part of pending prior application Ser. No. 15/395,738, filed Dec. 30, 2016, and entitled "A DRIVING CIRCUIT OF A POWER CIRCUIT".

BACKGROUND OF THE INVENTION

Field of the Invention

The disclosure relates generally to a driving circuit and a desaturation circuit integrated with a GaN power device.

Description of the Related Art

In a power circuit, a charge pump is always required to boost the supply voltage to a higher voltage for driving the power transistor. FIG. 1 illustrates a conventional power circuit. As shown in FIG. 1, the high-side driver DRV1 is configured to drive the first power transistor 110A, and the low-side driver DRV2 is configured to drive the second power transistor 110B. In addition, the boost capacitor CB and the boost diode DB are configured to boost the supply voltage VDD to the boost voltage VB, so that the first power transistor 110A can be fully turned on. Therefore, the first power transistor 110A supplied by the input voltage VIN and the second power transistor 110B can drive the load device RL through the inductor L and the capacitor C.

Since the inductor L may induce significant parasitic effects at the switch node SW (such as a negative voltage spike generated at the switch node SW by the turned-on body diode of the second power transistor 110B), these parasitic effects can interfere with the boost voltage VB when the boost capacitor CB is charged through the power transistor. Therefore, it is necessary to eliminate parasitic effects from the driving circuit.

BRIEF SUMMARY OF THE INVENTION

In an embodiment, a power circuit comprising a power transistor and a driving circuit is provided. The power transistor draws a power current from a loading node according to a driving voltage of a driving node and stops drawing the power current according to an over-current signal. The driving circuit comprises a high-side transistor, a low-side transistor, a charge pump, a pre-driver, and a desaturation circuit. The high-side transistor provides a supply voltage to the driving node according to a high-side voltage of a high-side node. The low-side transistor couples the driving node to a ground according to a first internal signal. The charge pump, which is coupled to the high-side node and the driving node, is configured to generate the high-side voltage that exceeds the supply voltage according to the first internal signal. The pre-driver generates the first internal signal according to a control signal, which is configured to improve driving capability of the control signal. The desaturation circuit determines that the power current exceeds a threshold to generate the over-current signal.

According to an embodiment of the invention, the power circuit further comprises a first hysteresis circuit. The first hysteresis circuit, which is coupled between the control signal and the pre-driver, receives the control signal to generate a second internal signal such that the pre-driver generates the first internal signal according to the second internal signal. The first hysteresis circuit is configured to provide a hysteresis for the control signal.

According to an embodiment of the invention, the desaturation circuit comprises a first desaturation resistor, a first desaturation normally-on transistor, a second desaturation normally-on transistor, a low-pass filter, a first desaturation normally-off transistor, a second desaturation normally-off transistor, a third desaturation normally-off transistor, and a second hysteresis circuit. The first desaturation resistor is coupled between the supply voltage and a first desaturation node. The first desaturation normally-on transistor comprises a gate terminal coupled to the first desaturation node, a source terminal coupled to the first desaturation node, and a drain terminal coupled to the loading node. The second desaturation normally-on transistor comprises a gate terminal coupled to a second desaturation node, a source terminal coupled to the second desaturation node, and a drain terminal coupled to the supply voltage. The low-pass filter filters out a ripple at the first desaturation node to generate a detection voltage at a detection node. The first desaturation normally-off transistor comprises a gate terminal coupled to the driving node, a source terminal coupled to the ground, and a drain terminal coupled to the second desaturation node. The second desaturation normally-off transistor supplies the supply voltage to the second desaturation node according to the first internal signal. The third desaturation normally-off transistor couples the detection node to the ground according to a voltage of the second desaturation node. The second hysteresis circuit determines whether the detection voltage exceeds the threshold and generates the over-current signal when the detection voltage exceeds the threshold.

According to an embodiment of the invention, the low-pass filter comprises a second desaturation resistor, a first desaturation unidirectional conducting device, a third desaturation resistor, and a second desaturation unidirectional conducting device. The second desaturation resistor is coupled between the first desaturation node and a third desaturation node. The first desaturation unidirectional conducting device, which has a first forward voltage, is turned ON when the ripple is lower than the ground by the first forward voltage. The third desaturation resistor is coupled between the third desaturation node and the detection node. The second desaturation unidirectional conducting device, which has a second forward voltage, is turned ON when the ripple exceeds the second forward voltage.

According to an embodiment of the invention, the second hysteresis circuit comprises a fourth desaturation resistor, a fourth desaturation normally-off transistor, a fifth desaturation normally-off transistor, a sixth desaturation normally-off transistor, a seventh desaturation normally-off transistor, and a third desaturation normally-on transistor. The fourth desaturation resistor is coupled between the supply voltage and a fourth desaturation node. The fourth desaturation normally-off transistor couples a fifth desaturation node to the ground according to the detection voltage. The fifth desaturation normally-off transistor couples the fourth desaturation node to the fifth desaturation node according to the detection voltage. The sixth desaturation normally-off transistor supplies the supply voltage to the fifth desaturation node according to a voltage of the fourth desaturation node.

The seventh desaturation normally-off transistor couples an over-current node to the ground according to the voltage of the fourth desaturation node. The third desaturation normally-on transistor comprises a gate terminal coupled to the over-current node, a source terminal coupled to the over-current node, and a drain terminal coupled to the supply voltage, in which the over-current signal is generated on the over-current node.

According to an embodiment of the invention, the desaturation circuit further comprises a pull-down transistor. The pull-down transistor couples the driving node to the ground in response to the over-current signal.

According to another embodiment of the invention, the desaturation circuit further comprises a pull-down transistor. The pull-down transistor pulls the first sub-internal signal down to the ground in response to the over-current signal.

According to yet another embodiment of the invention, the desaturation circuit further comprises a pull-down transistor. The pull-down transistor pulls the third sub-internal signal down to the ground in response to the over-current signal.

According to an embodiment of the invention, the control signal is generated by a controller, wherein the controller stops generating the control signal in response to the over-current signal.

According to another embodiment of the invention, the driving circuit further comprises a high-side normally-on transistor. The high-side normally-on transistor comprises a source terminal coupled to the driving node, a gate terminal coupled to the driving node, and a drain terminal supplied by the supply voltage. The high-side normally-on transistor is configured to improve the driving capability of the high-side transistor.

In another embodiment, a driving circuit for driving a power transistor, which draws a power current according to a driving voltage of a driving node, comprises a high-side transistor, a low-side transistor, a charge pump, a pre-driver, and a desaturation circuit. The high-side transistor provides a supply voltage to the driving node according to a high-side voltage of a high-side node. The low-side transistor couples the driving node to a ground according to a first internal signal. The charge pump is coupled to the high-side node and the driving node and configured to generate a high-side voltage that exceeds the supply voltage according to the first internal signal. The pre-driver generates the first internal signal according to a control signal and is configured to improve driving capability of the control signal. The pre-driver stops generating the first internal signal according to an over-current signal. The desaturation circuit determines that the power current exceeds a threshold to generate the over-current signal, in which the power transistor stops drawing the power current according to the over-current signal.

According to an embodiment of the invention, the driving circuit further comprises a first hysteresis circuit. The first hysteresis circuit, which is coupled between the control signal and the pre-driver, receives the control signal to generate a second internal signal such that the pre-driver generates the first internal signal according to the second internal signal. The first hysteresis circuit is configured to provide a hysteresis for the control signal.

According to an embodiment of the invention, the desaturation circuit comprises a first desaturation resistor, a first desaturation normally-on transistor, a second desaturation normally-on transistor, a low-pass filter, a first desaturation normally-off transistor, a second desaturation normally-off transistor, a third desaturation normally-off transistor, and a second hysteresis circuit. The first desaturation resistor is coupled between the supply voltage and a first desaturation node. The first desaturation normally-on transistor comprises a gate terminal coupled to the first desaturation node, a source terminal coupled to the first desaturation node, and a drain terminal coupled to a loading node. The second desaturation normally-on transistor comprises a gate terminal coupled to a second desaturation node, a source terminal coupled to the second desaturation node, and a drain terminal coupled to the supply voltage. The low-pass filter filters out a ripple at the first desaturation node to generate a detection voltage at a detection node. The first desaturation normally-off transistor comprises a gate terminal coupled to the driving node, a source terminal coupled to the ground, and a drain terminal coupled to the second desaturation node. The second desaturation normally-off transistor supplies the supply voltage to the second desaturation node according to the first internal signal. The third desaturation normally-off transistor couples the detection node to the ground according to a voltage of the second desaturation node. The second hysteresis circuit determines whether the detection voltage exceeds the threshold and generates an over-current signal when the detection voltage exceeds the threshold.

According to an embodiment of the invention, the low-pass filter comprises a second desaturation resistor, a first desaturation unidirectional conducting device, a third desaturation resistor, and a second desaturation unidirectional conducting device. The second desaturation resistor is coupled between the first desaturation node and a third desaturation node. The first desaturation unidirectional conducting device, which has a first forward voltage, is turned ON when the ripple is lower than the ground by the first forward voltage. The third desaturation resistor is coupled between the third desaturation node and the detection node. The second desaturation unidirectional conducting device, which has a second forward voltage, is turned ON when the ripple exceeds the second forward voltage.

According to an embodiment of the invention, the second hysteresis circuit comprises a fourth desaturation resistor, a fourth desaturation normally-off transistor, a fifth desaturation normally-off transistor, a sixth desaturation normally-off transistor, a seventh desaturation normally-off transistor, and a third desaturation normally-on transistor. The fourth desaturation resistor is coupled between the supply voltage and a fourth desaturation node. The fourth desaturation normally-off transistor couples a fifth desaturation node to the ground according to the detection voltage. The fifth desaturation normally-off transistor couples the fourth desaturation node to the fifth desaturation node according to the detection voltage. The sixth desaturation normally-off transistor supplies the supply voltage to the fifth desaturation node according to a voltage of the fourth desaturation node. The seventh desaturation normally-off transistor couples an over-current node to the ground according to the voltage of the fourth desaturation node. The third desaturation normally-on transistor comprises a gate terminal coupled to the over-current node, a source terminal coupled to the over-current node, and a drain terminal coupled to the supply voltage, in which the over-current signal is generated on the over-current node.

According to an embodiment of the invention, the desaturation circuit further comprises a pull-down transistor. The pull-down transistor couples the driving node to the ground in response to the over-current signal.

According to another embodiment of the invention, the desaturation circuit further comprises a pull-down transistor.

The pull-down transistor pulls the first sub-internal signal down to the ground in response to the over-current signal.

According to yet another embodiment of the invention, the desaturation circuit further comprises a pull-down transistor. The pull-down transistor pulls the third sub-internal signal down to the ground in response to the over-current signal.

According to an embodiment of the invention, the control signal is generated by a controller, wherein the controller stops generating the control signal in response to the over-current signal.

According to another embodiment of the invention, the driving circuit further comprises a high-side normally-on transistor. The high-side normally-on transistor comprises a source terminal coupled to the driving node, a gate terminal coupled to the driving node, and a drain terminal supplied by the supply voltage. The high-side normally-on transistor is configured to improve the driving capability of the high-side transistor.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
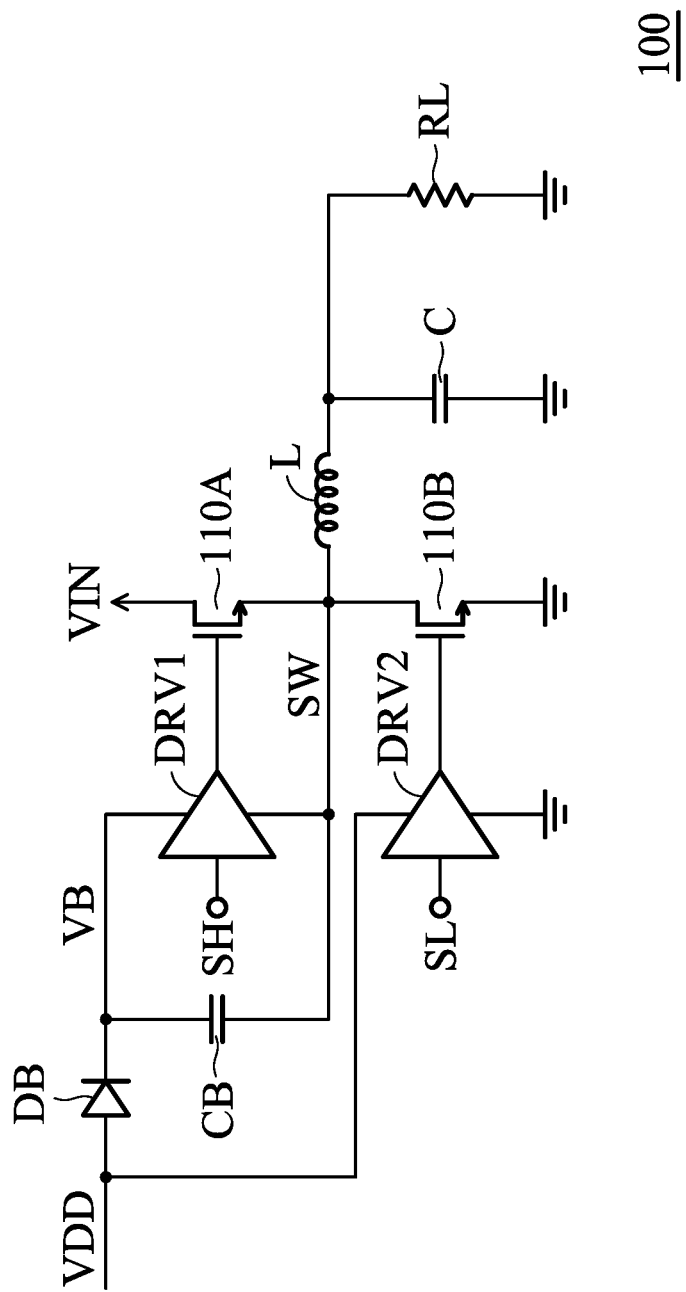
FIG. 1 illustrates a conventional power circuit.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, so that the features are not in direct contact.

Figure 2:
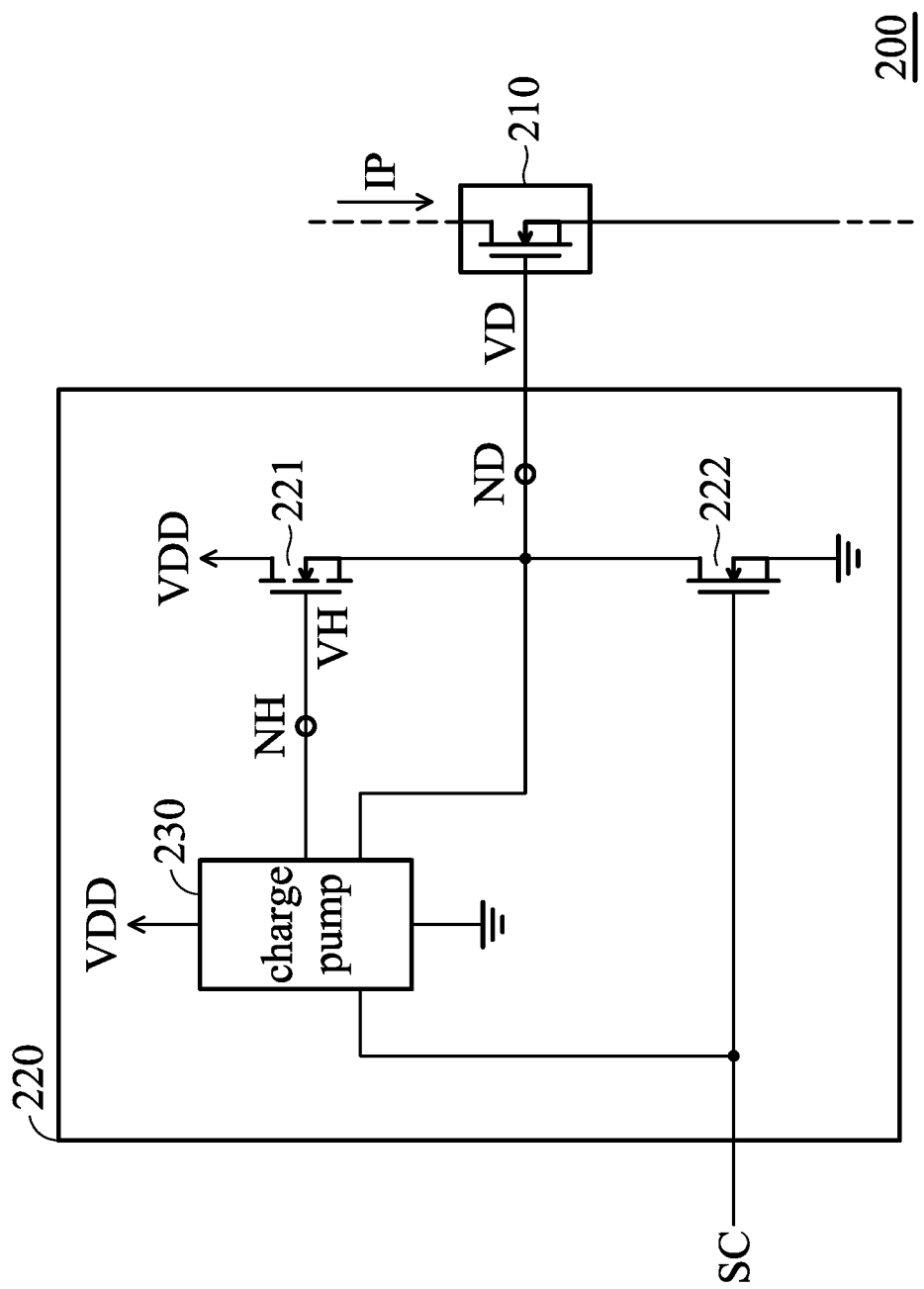
FIG. 2 is a block diagram of a power circuit in accordance with an embodiment of the invention.

FIG. 2 is a block diagram of a power circuit in accordance with an embodiment of the invention. As shown in FIG. 2, the power circuit 200 includes a power transistor 210 and a driving circuit 220. The power transistor 210 draws the power current IP according to the driving voltage VD of the driving node ND. According to an embodiment of the invention, the power transistor 210 is a GaN transistor.

The driving circuit 220 includes a high-side transistor 221, a low-side transistor 222, and a charge pump 230. The high-side transistor 221 supplies the supply voltage VDD to the driving node ND according to the high-side voltage VH of the high-side node NH. The low-side transistor 222 is coupled between the driving node ND and the ground, and configured to pull the driving voltage VD down to the ground according to the control signal SC. According to an embodiment of the invention, the high-side transistor 221 and the low-side transistor 222 are normally-off transistors.

The charge pump 230 is supplied by the supply voltage VDD and the ground and coupled to the high-side node NH and the driving node ND. For the sake of fully turning on the high-side transistor 221, the charge pump 230 is configured to generate the high-side voltage VH exceeding the supply voltage VDD, so that the gate-to-source voltage of the high-side transistor 221 at least exceeds the threshold voltage to apply the supply voltage VDD to the driving node ND. According to an embodiment of the invention, the driving circuit 220 is a rail-to-rail driver, so that the driving voltage VD ranges from the supply voltage VDD to the ground level.

Figure 3:
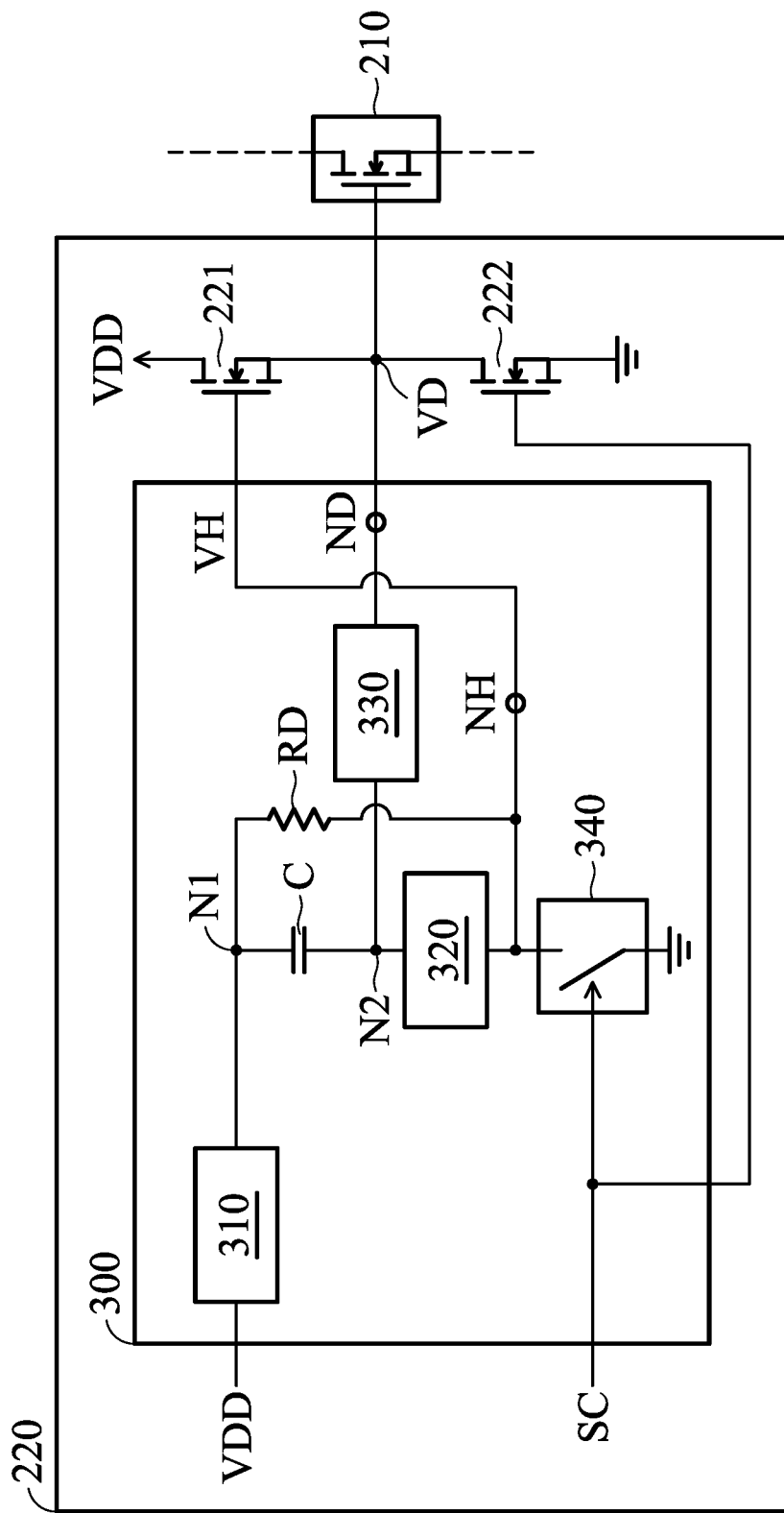
FIG. 3 shows a schematic diagram of the charge pump in the power circuit 200 of FIG. 2 in accordance with the invention.

FIG. 3 shows a schematic diagram of the charge pump in the power circuit 200 of FIG. 2 in accordance with the invention. As shown in FIG. 3, the charge pump 300, which is coupled to the driving node ND and the high-side node NH, includes a first unidirectional conducting device 310, a discharge resistor RD, a capacitor C, a second unidirectional conducting device 320, a third unidirectional conducting device 330, and a switch 340.

When the supply voltage VDD exceeds the voltage of the first node N1, the first unidirectional conducting device 310 is turned ON. When the voltage VDD does not exceed the voltage of the first node N1, the first unidirectional conducting device 310 is turned OFF. The capacitor C is coupled between the first node N1 and the second node N2. The discharge resistor RD is coupled between the first node N1 and the high-side node NH.

The second unidirectional conducting device 320 is coupled between the second node N2 and the high-side node NH. When the voltage of the second node N2 exceeds the high-side voltage VH, the second unidirectional conducting device 320 is turned ON. When the voltage of the second node N2 does not exceed the high-side voltage VH, the second unidirectional conducting device 320 is turned OFF.

The third unidirectional conducting device 330 is coupled between the driving node ND and the second node N2. When the driving voltage VD of the driving node ND exceeds the voltage of the second node N2, the third unidirectional conducting device 330 is turned ON. When the driving voltage VD does not exceed the voltage of the second node N2, the third unidirectional conducting device 330 is turned OFF.

The switch 340 receives the control signal SC and is coupled between the high-side node NH and the ground. In addition, the switch 340 is configured to couple the high-side node NH to the ground according to the control signal SC.

For the simplicity of illustration, the switch 340 is illustrated herein as an N-type transistor. According to an embodiment of the invention, when the control signal SC is at the high voltage level, such as the supply voltage VDD, the switch 340 is turned ON and the capacitor C is charged by the supply voltage VDD through the first unidirectional conducting device 310, the second unidirectional conducting device 320, and the switch 340 to the ground.

According to another embodiment of the invention, when the control signal SC is at the low voltage level, such as the ground level, the switch 340 is turned OFF and the third unidirectional conducting device 330 provides the driving voltage VD to the second node N2, so that the capacitor C is discharged to the driving node ND through the discharge resistor RD.

According to an embodiment of the invention, the resistance of the discharge resistor RD determines the maximum voltage that the capacitor C can be charged and also the maximum voltage that the high-side voltage VH can be achieved. In addition, the larger the resistance of the discharge resistor RD is, the lower the rising speed of the high-side voltage VD could be achieved. Therefore, there is a trade-off on the resistance of the discharge resistor RD.

According to an embodiment of the invention, each of the first unidirectional conducting device 310, the second unidirectional conducting device 320, and the third unidirectional conducting device 330 is a diode. According to another embodiment of the invention, each of the first unidirectional conducting device 310, the second unidirectional conducting device 320, and the third unidirectional conducting device 330 is a diode-connected normally-off transistor.

Figure 4:
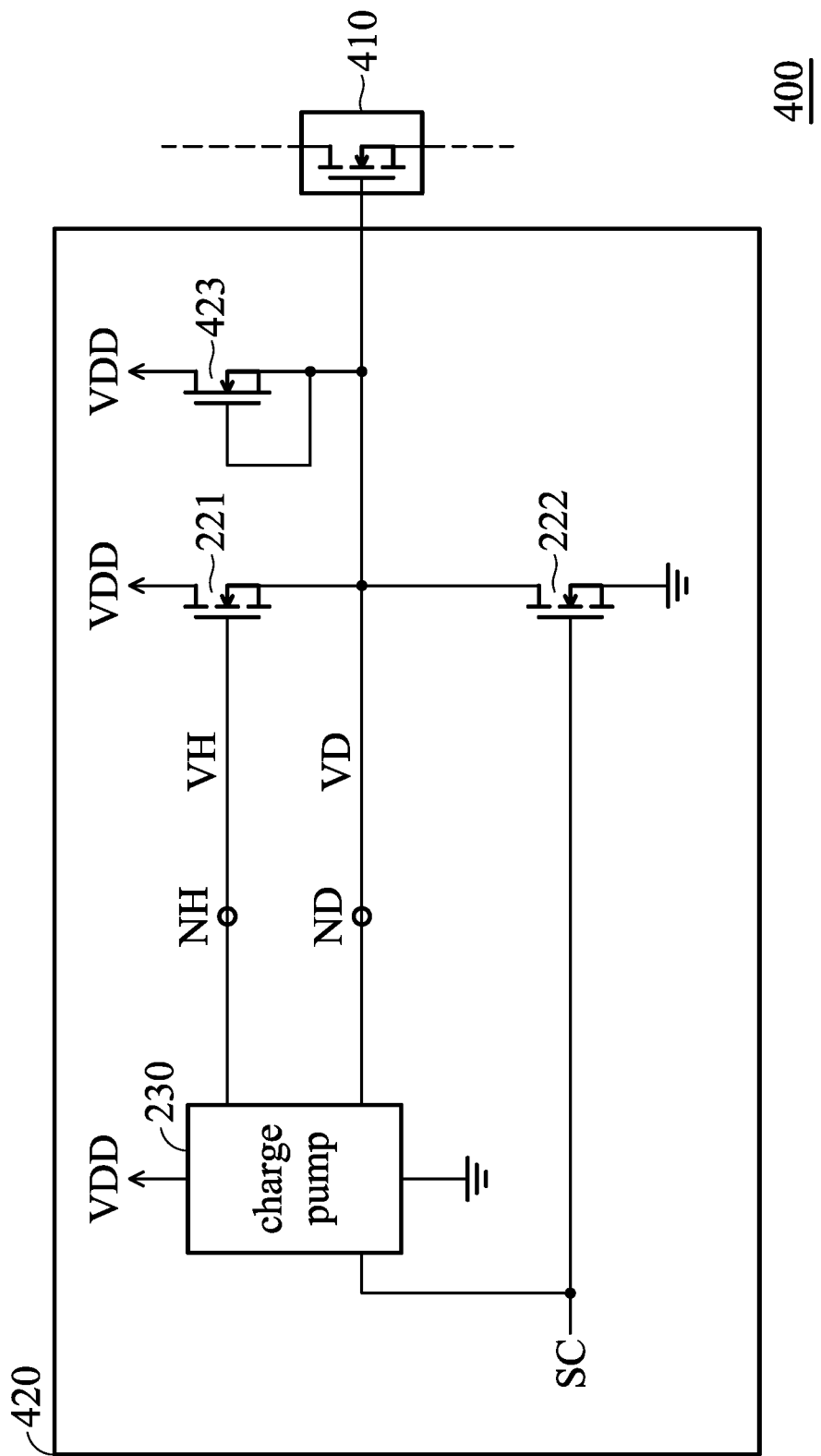
FIG. 4 shows a block diagram of a power circuit in accordance with another embodiment of the invention.

FIG. 4 shows a block diagram of a power circuit in accordance with another embodiment of the invention. As shown in FIG. 4, the power circuit 400 includes a power transistor 410 and a driving circuit 420, in which the power transistor 410 and the driving circuit 420 respectively correspond to the power transistor 210 and the driving circuit 220 in FIG. 2.

The driving circuit 420 further includes a high-side normally-on transistor 423. The source terminal and the gate terminal of the high-side normally-on transistor 423 are coupled to the driving node ND, and the drain terminal of the high-side normally-on transistor 423 is supplied by the supply voltage VDD. The high-side normally-on transistor 423 is always turned on to improve the driving capability of the high-side transistor 221.

Figure 5:
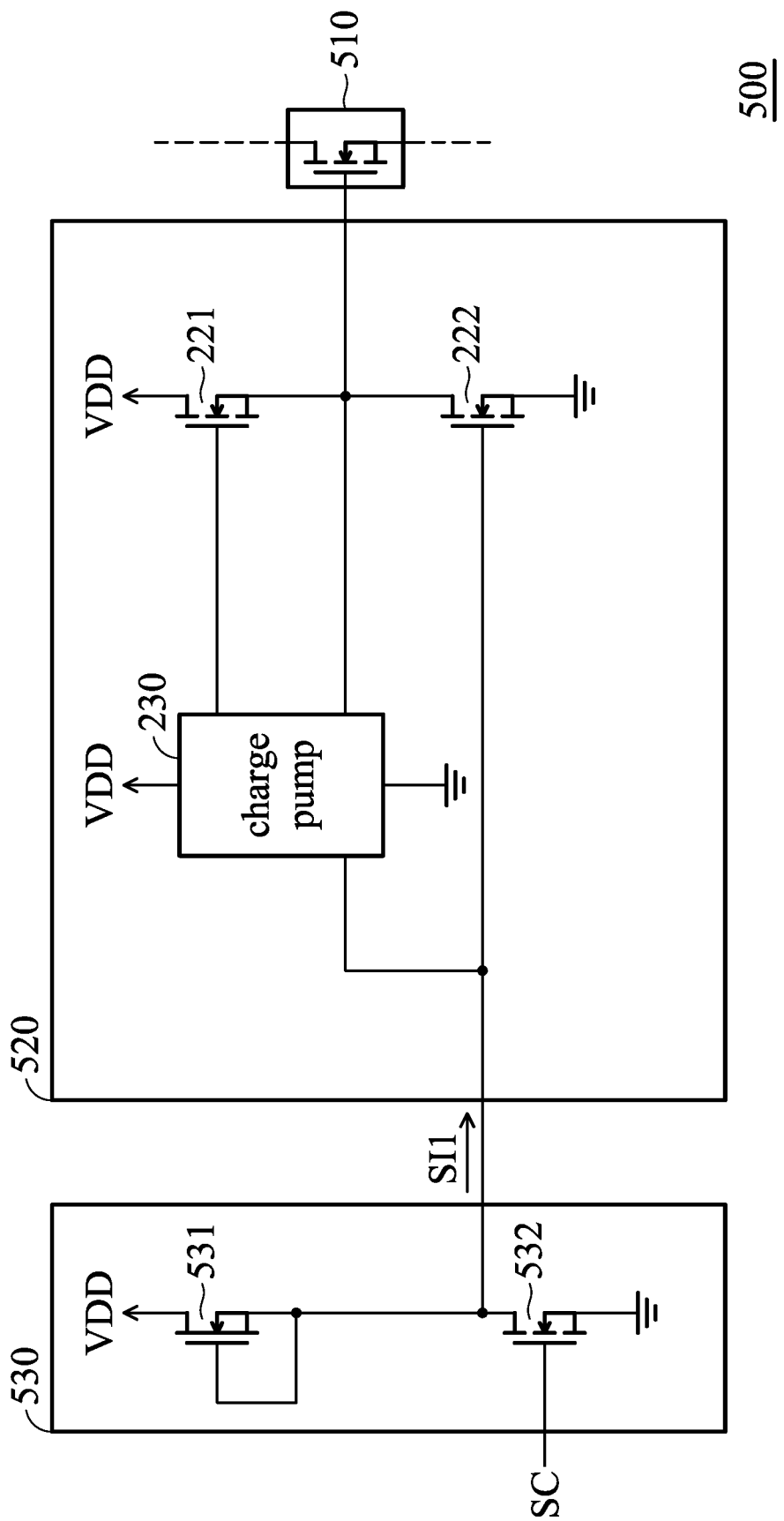
FIG. 5 shows a block diagram of a power circuit in accordance with yet another embodiment of the invention.

FIG. 5 shows a block diagram of a power circuit in accordance with yet another embodiment of the invention. As shown in FIG. 5, the power circuit 500 includes a power transistor 510, a driving circuit 520, and a first pre-driver 530, in which the power transistor 510 and the driving circuit 520 respectively correspond to the power transistor 210 and the driving circuit 220 in FIG. 2.

The first pre-driver 530 receives the control signal SC to generate the first internal signal SI1 to the driving circuit 520 for improving the driving capability of the control signal SC. The first pre-driver 530 includes a first normally-on transistor 531 and a first normally-off transistor 532.

The gate terminal and the source terminal of the first normally-on transistor 531 are coupled to the driving circuit 520, and the drain terminal of the first normally-on transistor 531 is supplied by the supply voltage VDD. The gate terminal of first normally-off transistor 532 receives the control signal SC, the source terminal of first normally-off transistor 532 is coupled to the ground, and the drain terminal of first normally-off transistor 532 is coupled to the driving circuit 520.

Figure 6:
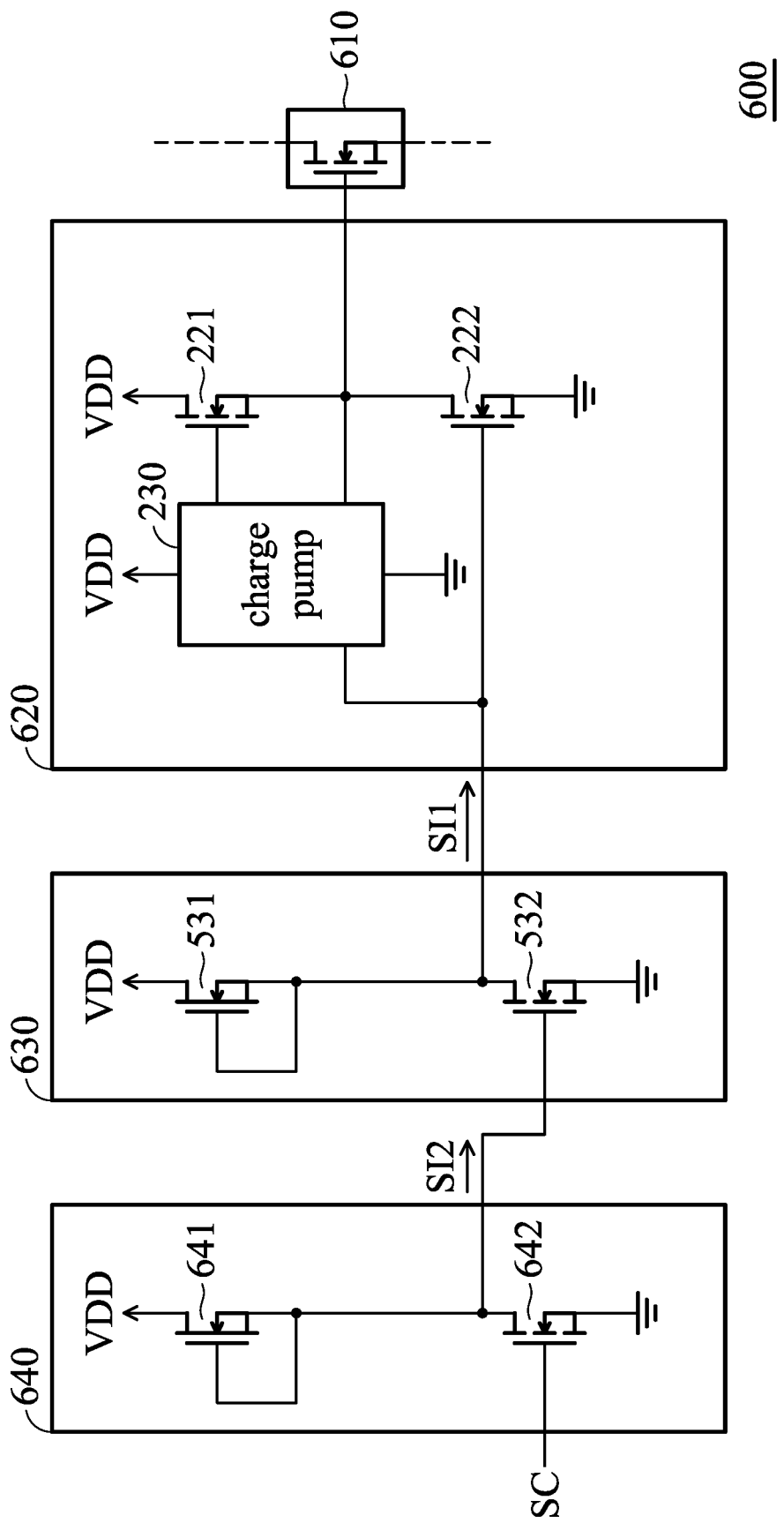
FIG. 6 shows a block diagram of a power circuit in accordance with yet another embodiment of the invention.

FIG. 6 shows a block diagram of a power circuit in accordance with yet another embodiment of the invention. As shown in FIG. 6, the power circuit 600 includes a power transistor 610, a driving circuit 620, a first pre-driver 630, and a second pre-driver 640, in which the power transistor 610, the driving circuit 620, and the first pre-driver 630 respectively correspond to the power transistor 510, the driving circuit 520, and the first pre-driver 530 in FIG. 5.

The second pre-driver 640 receives the control signal SC to generate the second internal signal SI2 to the first pre-driver 630 for further improving the driving capability of the control signal SC. The second pre-driver 640 includes a second normally-on transistor 641 and a second normally-off transistor 642.

The gate terminal and the source terminal of the second normally-on transistor 641 are coupled to the gate terminal of the first normally-off transistor 532 in the first pre-driver 630, and the drain terminal of the second normally-on transistor 641 is supplied by the supply voltage VDD. The gate terminal of the second normally-off transistor 642 receives the control signal SC, the source terminal of the second normally-off transistor 642 is coupled to the ground, and the drain terminal is coupled to the gate terminal of the first normally-off transistor 532 in the first pre-driver 630.

Figure 7:
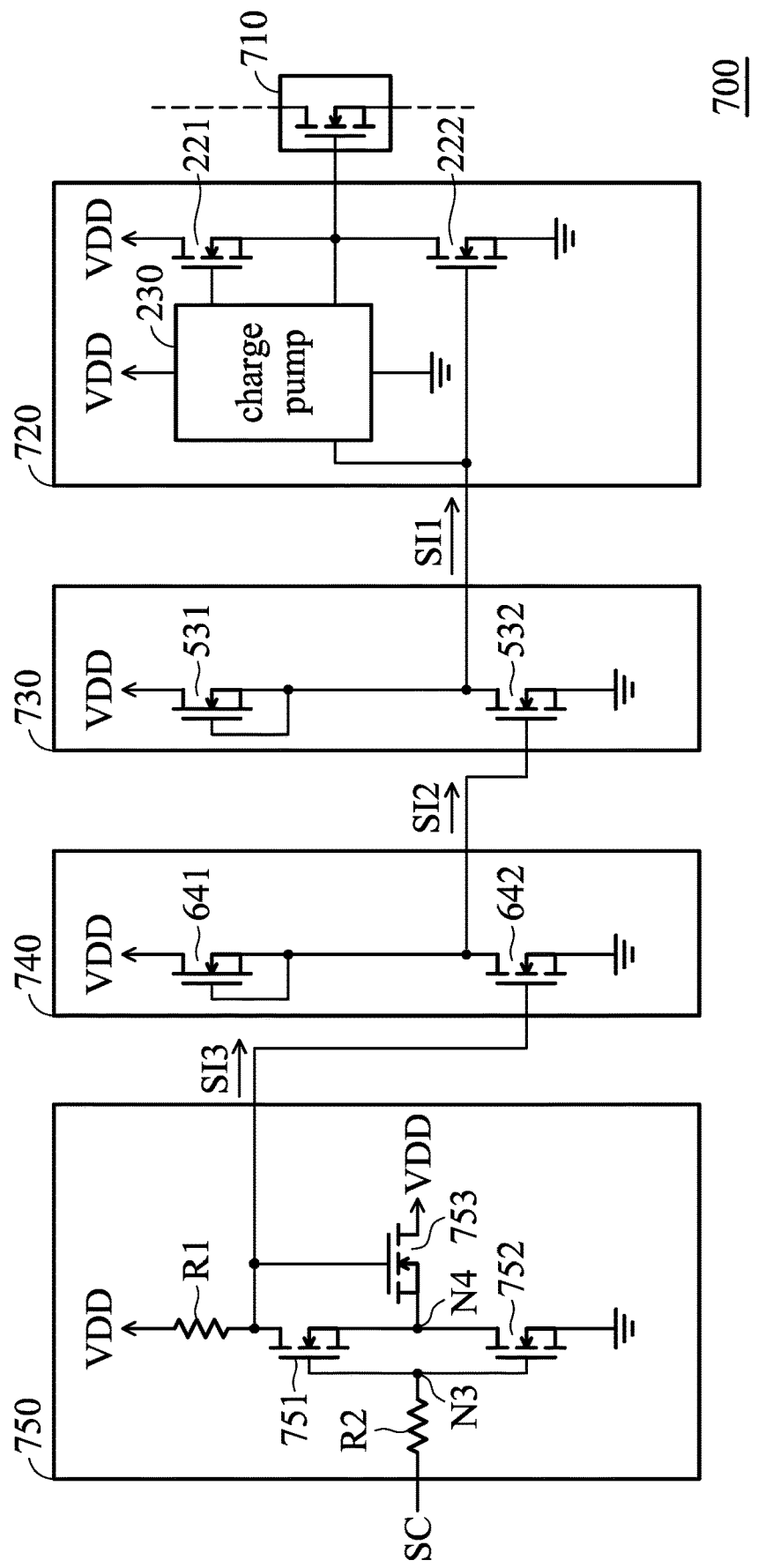
FIG. 7 shows a block diagram of a power circuit in accordance with yet another embodiment of the invention.

FIG. 7 shows a block diagram of a power circuit in accordance with yet another embodiment of the invention. As shown in FIG. 7, the power circuit 700 includes a power transistor 710, a driving circuit 720, a first pre-driver 730, a second pre-driver 740, and a first hysteresis circuit 750, in which the power transistor 710, the driving circuit 720, the first pre-driver 730, and the second pre-driver 740 respectively correspond to the power transistor 610, the driving circuit 620, the first pre-driver 630, and the second pre-driver 640 in FIG. 6.

The first hysteresis circuit 750 receives the control signal SC to generate the third internal signal SI3 to the second pre-driver 740 for further providing a hysteresis for the control signal SC. The first hysteresis circuit 750 includes a first resistor R1, a third normally-off transistor 751, a fourth normally-off transistor 752, a fifth normally-off transistor 753, and a second resistor R2.

The first resistor R1 is coupled between the supply voltage VDD and the gate terminal of the second normally-off transistor 642 in the second pre-driver 740. The gate terminal of the third normally-off transistor 751 is coupled to a third node N3, the source terminal of the third normally-off transistor 751 is coupled to the fourth node N4, and the drain terminal of the third normally-off transistor 751 is coupled to the first resistor R1 and the gate terminal of the second normally-off transistor 642 in the second pre-driver 740. The gate terminal of the fourth normally-off transistor 752 is coupled to the third node N3, the source terminal of the fourth normally-off transistor 752 is coupled to the ground, and the drain terminal of the fourth normally-off transistor 752 is coupled to the fourth node N4.

The gate terminal of the fifth normally-off transistor 753 is coupled to the first resistor R1 and the gate terminal of the second normally-off transistor 642 in the second pre-driver 740, the source terminal of the fifth normally-off transistor 753 is coupled to the fourth node N4, and the drain terminal of the fifth normally-off transistor 753 is supplied by the supply voltage VDD. The second resistor R2 is coupled to the third node and receives the control signal SC.

Figure 8:
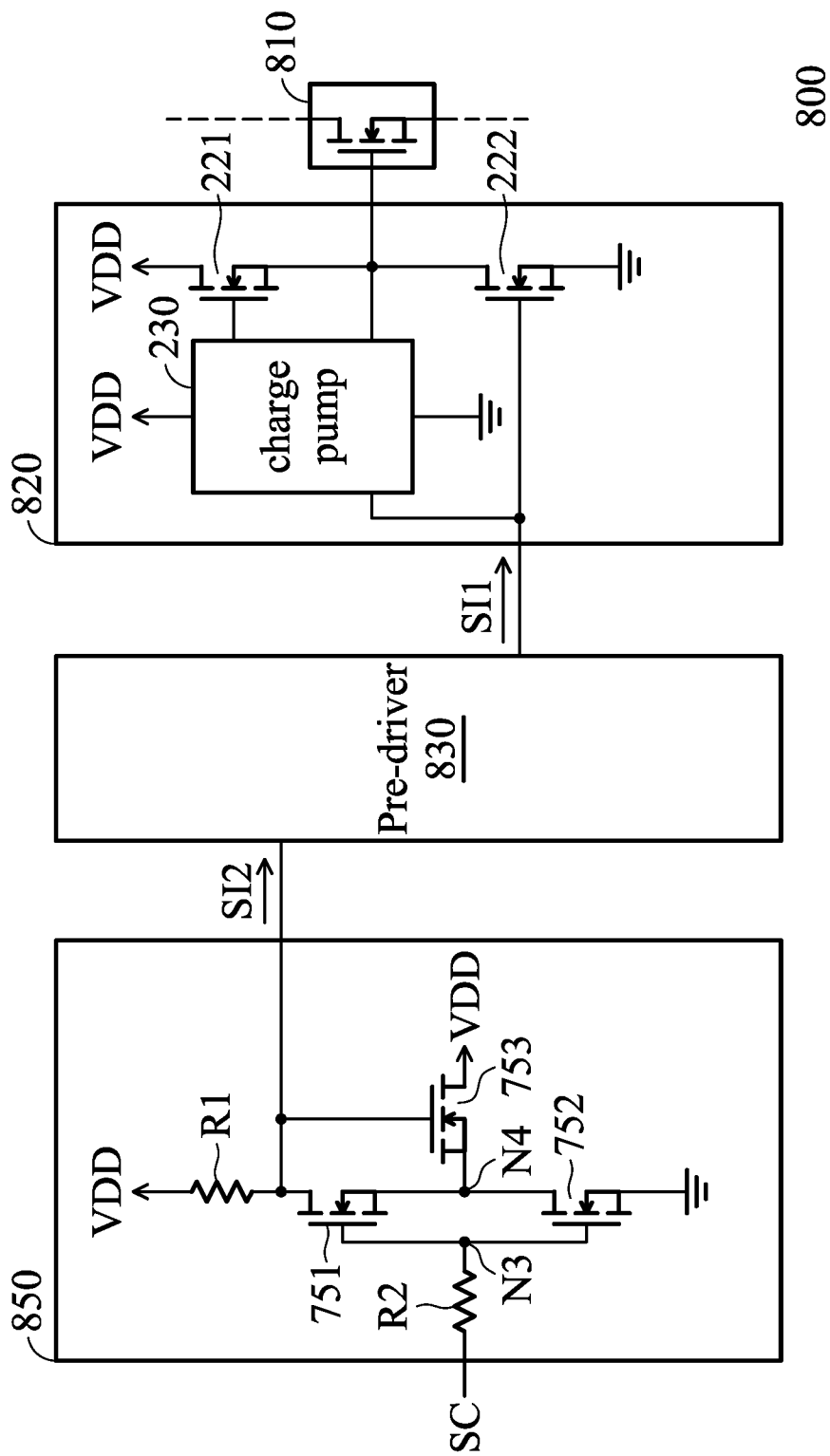
FIG. 8 shows a block diagram of a power circuit in accordance with yet another embodiment of the invention.

FIG. 8 shows a block diagram of a power circuit in accordance with yet another embodiment of the invention. As shown in FIG. 8, the power circuit 800 includes a power transistor 810, a driving circuit 820, a pre-driver 830, and a first hysteresis circuit 850, in which the power transistor 810, the driving circuit 820, and the first hysteresis circuit 850 respectively correspond to the power transistor 710, the driving circuit 720, and the first hysteresis circuit 750 in FIG. 7.

According to an embodiment of the invention, the pre-driver 830 generates the first internal signal SI1 according to the second internal signal SI2 for improving the driving capability of the control signal SC. According to an embodiment of the invention, the first internal signal SI1 and the second internal signal SI2 are in-phase.

Figure 9:
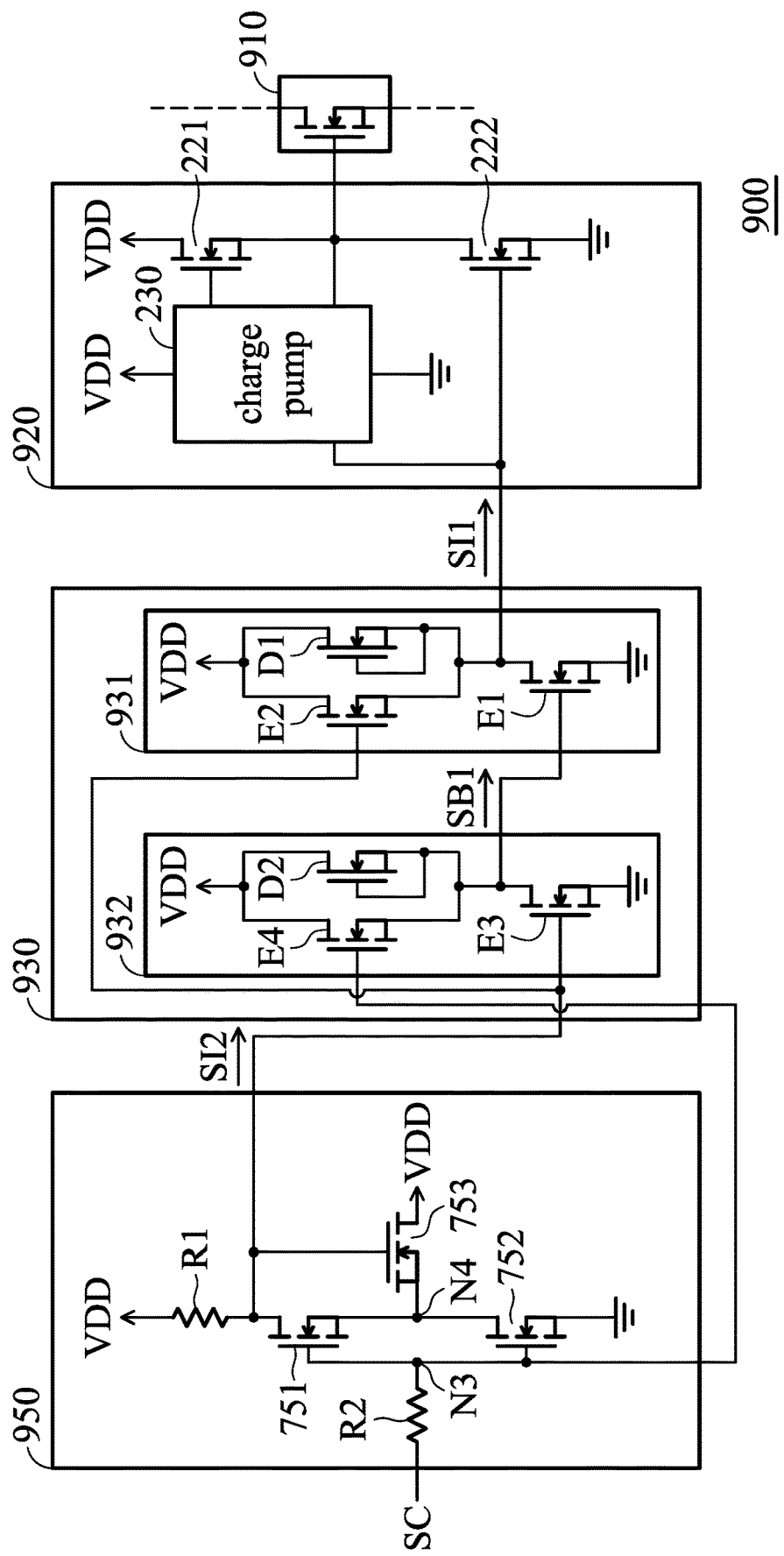
FIG. 9 shows a block diagram of a power circuit in accordance with yet another embodiment of the invention.

FIG. 9 shows a block diagram of a power circuit in accordance with yet another embodiment of the invention. As shown in FIG. 9, the power circuit 900 includes a power transistor 910, a driving circuit 920, a pre-driver 930, and a first hysteresis circuit 950, in which the power transistor 910, the driving circuit 920, the pre-driver 930, and the first hysteresis circuit 950 respectively correspond to the power transistor 810, the driving circuit 820, the pre-driver 830, and the first hysteresis circuit 850 in FIG. 8.

As shown in FIG. 9, the pre-driver 930 includes a first sub pre-driver 931 and a second sub pre-driver 932. The first sub pre-driver 931 includes a first sub normally-off transistor E1, a second sub normally-off transistor E2, and a first sub normally-on transistor D1, in which the first sub pre-driver 931 generates the first internal signal SI1 according to a first sub-internal signal SB1.

The gate terminal of the first sub normally-off transistor E1 receives the first sub-internal signal SB1, and the source terminal of the first sub normally-off transistor E1 is coupled to the ground. The gate terminal of the second sub normally-off transistor E2 receives the second internal signal SI2. Namely, the gate terminal of the second sub normally-off transistor E2 is coupled to the gate terminal of the third sub normally-on transistor E3. The drain terminal of the second sub normally-off transistor E2 is supplied by the supply voltage VDD.

The source terminal of the second sub normally-off transistor E2 is coupled to the drain terminal of the first sub normally-off transistor E1, in which the drain terminal of the first sub normally-off transistor E1 generates the first internal signal SI1 to the driving circuit 920. The gate and source terminals of the first sub normally-on transistor D1 are coupled together. The drain terminal of the first sub normally-on transistor D1 is supplied by the supply voltage VDD.

The second sub pre-driver 932 includes a third sub normally-off transistor E3, a fourth sub normally-off transistor E4, and a second sub normally-on transistor D2, in which the second sub pre-driver 932 generates the first sub-internal signal SB1 according to the second internal signal SI2.

The gate terminal of the third sub normally-off transistor E3 receives the second internal signal SI2, and the source terminal of the third sub normally-off transistor E3 is coupled to the ground. The gate terminal of the fourth sub normally-off transistor E4 is coupled to the third node N3 in the first hysteresis circuit 950. The drain terminal of the fourth sub normally-off transistor E4 is supplied by the supply voltage VDD.

The source terminal of the fourth sub normally-off transistor E4 is coupled to the drain terminal of the third sub normally-off transistor E3, in which the drain terminal of the third sub normally-off transistor E3 generates the first sub-internal signal SB1 to the first sub pre-driver 931. The gate and source terminals of the second sub normally-on transistor D2 are coupled together. The drain terminal of the second sub normally-on transistor D2 is supplied by the supply voltage VDD.

Figure 10:
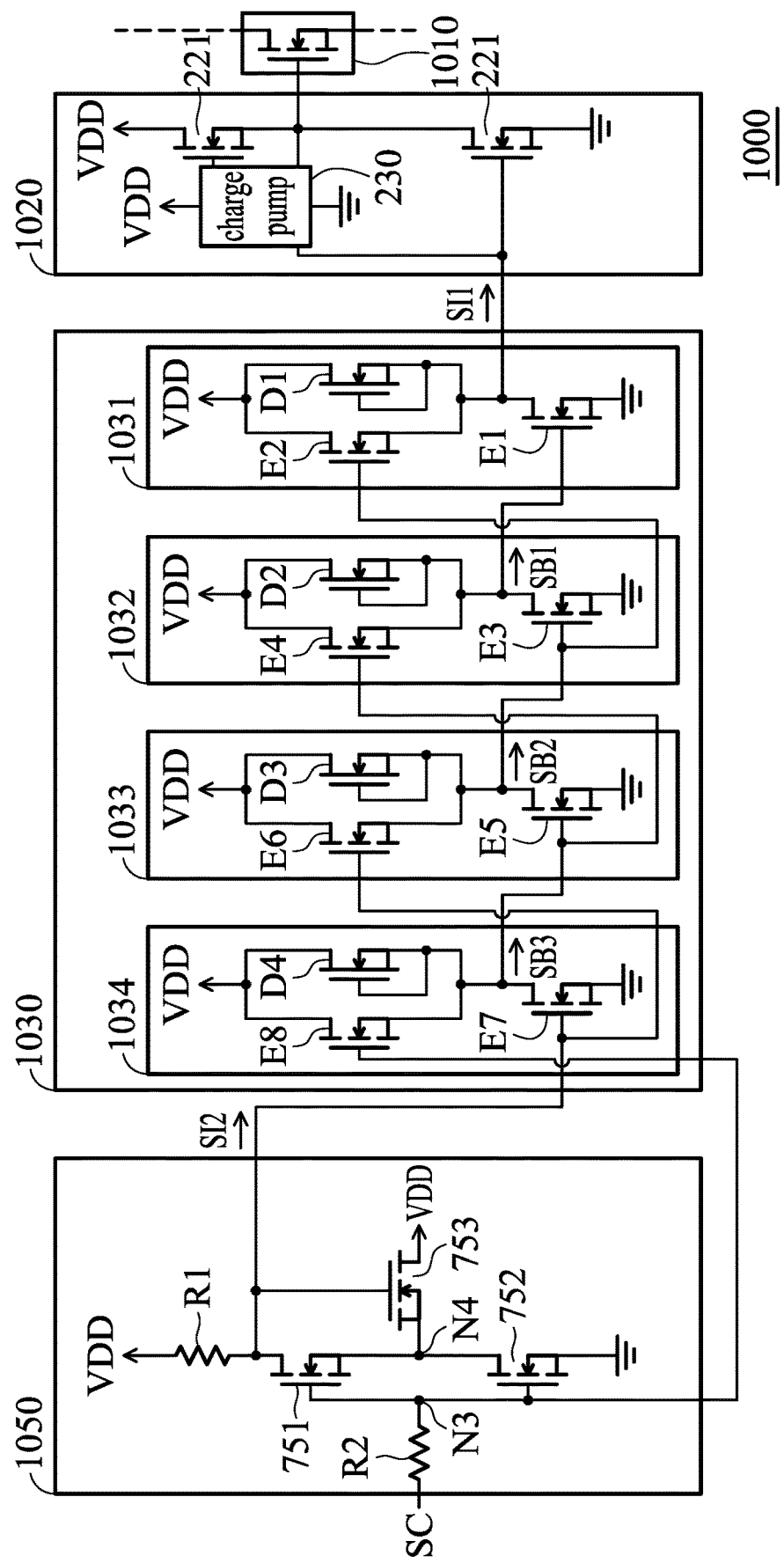
FIG. 10 shows a block diagram of a power circuit in accordance with yet another embodiment of the invention.

FIG. 10 shows a block diagram of a power circuit in accordance with yet another embodiment of the invention. As shown in FIG. 10, the power circuit 1000 includes a power transistor 1010, a driving circuit 1020, a pre-driver 1030, and a first hysteresis circuit 1050, in which the power transistor 1010, the driving circuit 1020, the pre-driver 1030, and the first hysteresis circuit 1050 respectively correspond to the power transistor 910, the driving circuit 920, the pre-driver 930, and the first hysteresis circuit 950 in FIG. 9.

As shown in FIG. 10, the pre-driver 1030 includes a first sub pre-driver 1031, a second sub pre-driver 1032, a third sub pre-driver 1033, and a fourth sub pre-driver 1034, in which the first sub pre-driver 1031 and the second sub pre-driver 1032 respectively correspond to the first sub pre-driver 931 and the second sub pre-driver 932 in FIG. 9, which are not repeated herein.

The second sub pre-driver 1032 includes a third sub normally-off transistor E3, a fourth sub normally-off transistor E4, and a second sub normally-on transistor D2, in which the second sub pre-driver 1032 generates the first sub-internal signal SB1 according to the second sub-internal signal SB2.

The gate terminal of the third sub normally-off transistor E3 receives the second sub-internal signal SB2, and the source terminal of the third sub normally-off transistor E3 is coupled to the ground. The gate terminal of the fourth sub normally-off transistor E4 receives the third sub-internal signal SB3. The drain terminal of the fourth sub normally-off transistor E4 is supplied by the supply voltage VDD.

The source terminal of the fourth sub normally-off transistor E4 is coupled to the drain terminal of the third sub normally-off transistor E3, in which the drain terminal of the third sub normally-off transistor E3 generates the second sub-internal signal SB2 to the first sub pre-driver 1031. The gate terminal and the source terminal of the second sub normally-on transistor D2 are coupled together. The drain terminal of the second sub normally-on transistor D2 is supplied by the supply voltage VDD.

The third sub pre-driver 1033 includes a fifth sub normally-off transistor E5, a sixth sub normally-off transistor E6, and a third sub normally-on transistor D3, in which the third sub pre-driver 1033 generates the second sub-internal signal SB2 according to the third sub-internal signal SB3.

The gate terminal of the fifth sub normally-off transistor E5 receives the third sub-internal signal SB3, and the source terminal of the fifth sub normally-off transistor E5 is coupled to the ground. The gate terminal of the sixth sub normally-off transistor E6 receives the second internal signal SI2. The drain terminal of the sixth sub normally-off transistor E6 is supplied by the supply voltage VDD.

The source terminal of the sixth sub normally-off transistor E6 is coupled to the drain terminal of the fifth sub normally-off transistor E5, in which the drain terminal of the fifth sub normally-off transistor E5 generates the second sub-internal signal SB2 to the second sub pre-driver 1032. The gate and source terminals of the third sub normally-on transistor D3 are coupled together. The drain terminal of the third sub normally-on transistor D3 is supplied by the supply voltage VDD.

The fourth sub pre-driver 1034 includes a seventh sub normally-off transistor E7, an eighth sub normally-off transistor E8, and a fourth sub normally-on transistor D4, in which the fourth sub pre-driver 1034 generates the third sub-internal signal SB3 according to the second internal signal SI2.

The gate terminal of the seventh sub normally-off transistor E7 receives the second internal signal SI2, the source terminal of the seventh sub normally-off transistor E7 is coupled to the ground. The gate terminal of the eighth sub normally-off transistor E8 is coupled to the third node N3 in the first hysteresis circuit 1050. The drain terminal of the eighth sub normally-off transistor E8 is supplied by the supply voltage VDD.

The source terminal of the eighth sub normally-off transistor E8 is coupled to the drain terminal of the seventh sub normally-off transistor E7, in which the drain terminal of the seventh sub normally-off transistor E7 generates the third sub-internal signal SB3 to the third sub pre-driver 1033. The gate and source terminals of the fourth sub normally-on transistor D4 are coupled together. The drain terminal of the fourth sub normally-on transistor D4 is supplied by the supply voltage VDD.

According to other embodiments of the invention, the pre-driver 830 in FIG. 8 may include an even number of the sub pre-drivers such that the first internal signal SI1 and the second internal signal SI2 are in-phase.

Figure 11:
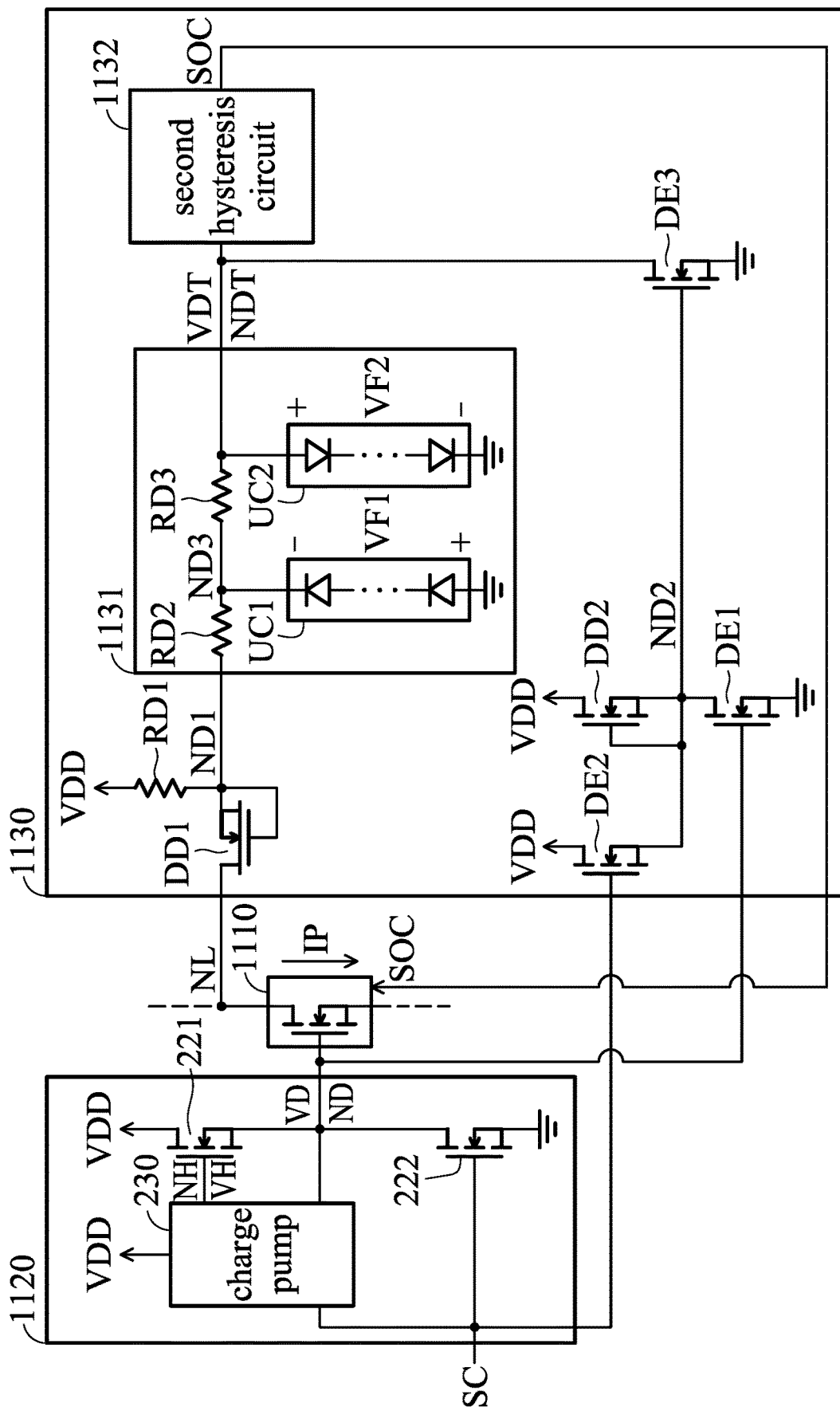
FIG. 11 shows a schematic diagram of a power circuit in accordance with yet another embodiment of the invention.

FIG. 11 shows a schematic diagram of a power circuit in accordance with yet another embodiment of the invention. As shown in FIG. 11, the power circuit 1100 includes a power transistor 1110, a driving circuit 1120, and a desaturation circuit 1130, in which the power transistor 1110 and the driving circuit 1120 correspond to the power transistor 1010 and the driving circuit 1020.

The desaturation circuit 1130, which determines that the power current IP exceeds a threshold to generate the over-current signal SOC, includes a first desaturation resistor RD1, a first desaturation normally-on transistor DD1, a second desaturation normally-on transistor DD2, a low-pass filter 1131, a first desaturation normally-off transistor DE1, a second desaturation normally-off transistor DE2, a third desaturation normally-off transistor DE3, and a second hysteresis circuit 1132.

The first desaturation resistor RD1 is coupled between the supply voltage VDD and a first desaturation node ND1. The first desaturation normally-on transistor DD1, which is configured to sustain the high voltage at the loading node NL, includes a gate terminal coupled to the first desaturation node ND1, a source terminal coupled to the first desaturation node ND1, and a drain terminal coupled to the loading node NL, in which the drain terminal of the power transistor 1110 is coupled to the loading node NL.

The low-pass filter 1131 filters out a ripple at the first desaturation node ND1 to generate a detection voltage VDT at a detection node NDT. According to an embodiment of the invention, the first desaturation normally-on transistor DD1 passes the voltage of the loading node NL to the first desaturation node ND1, and the low-pass filter 1131 is configured to filter out the ripple at the first desaturation node ND1 to generate the DC detection voltage VDT at the detection node VDT.

As shown in FIG. 11, the low-pass filter 1131 includes a second desaturation resistor RD2, a first desaturation unidirectional conducting device UC1, a third desaturation resistor RD3, and a second desaturation unidirectional conducting device UC2. The second desaturation resistor RD2 is coupled between the first desaturation node ND1 and a third desaturation node ND3.

The first desaturation unidirectional conducting device UC1 has a first forward voltage VF1. When the ripple at the first desaturation node ND1 is lower than the ground by the first forward voltage VF1, the first desaturation unidirectional conducting device UC1 is turned ON to suppress the ripple.

According to some embodiments of the invention, the first desaturation unidirectional conducting device UC1 includes at least one diode in series, and the first forward voltage VF1 is the sum of the forward voltage of the at least one diode in the first desaturation unidirectional conducting device UC1.

The third desaturation resistor RD3 is coupled between the third desaturation node ND3 and the detection node NDT. The second desaturation unidirectional conducting device UC2 has a second forward voltage VF2. When the ripple at the first desaturation node ND1 exceeds the second forward voltage VF2, the second desaturation unidirectional conducting device UC2 is turned ON to suppress the ripple.

According to some embodiments of the invention, the second desaturation unidirectional conducting device UC2 includes at least one diode in series, and the second forward voltage VF2 is the sum of the forward voltage of the at least one diode in the second desaturation unidirectional conducting device UC2.

The second hysteresis circuit 1132 determines whether the detection voltage VDT exceeds the threshold and generates the over-current signal SOC when the detection voltage VDT exceeds the threshold. According to an embodiment of the invention, the threshold can be determined by the designer.

The second desaturation normally-on transistor DD2 includes a gate terminal coupled to a second desaturation node ND2, a source terminal coupled to the second desaturation node ND2, and a drain terminal coupled to the supply voltage VDD.

The first desaturation normally-off transistor DE1 includes a gate terminal coupled to the driving node ND, a source terminal coupled to the ground, and a drain terminal coupled to the second desaturation node ND2.

The second desaturation normally-off transistor DE2 supplies the supply voltage VDD to the second desaturation node ND2 according to the voltage of the gate terminal of the low-side transistor 222. In the embodiment, the voltage of the gate terminal of the low-side transistor 222 is the control signal SC. The third desaturation normally-off transistor DE3 couples the detection node NDT to the ground according to a voltage of the second desaturation node ND2.

According to an embodiment of the invention, when the power transistor 1110 is turned ON to draw the power current IP, the control signal SC is in the low logic level to turn OFF the low-side transistor 222 and the high-side transistor 221 is turned ON to supply the supply voltage VDD to the driving node ND.

Meanwhile, the first desaturation normally-off transistor DE1 is turned ON according to the driving voltage VD and the second desaturation normally-off transistor DE2 is turned OFF according to the control signal SC, so that the third desaturation normally-off transistor DE3 is turned OFF.

When the voltage of the loading node NL exceeds the supply voltage VDD, the first desaturation normally-on transistor DD1 passes the voltage of the loading node NL to the first desaturation node ND1. The low-pass filter 1131 filters out the ripple at the first desaturation node ND1 and passes the DC voltage of the first desaturation node ND1 to the detection node NDT as the detection voltage VDT.

When the second hysteresis circuit 1132 determines that the detection voltage VDT exceeds the threshold, the second hysteresis circuit 1132 generates the over-current signal SOC to turn OFF the power transistor 1110, in order to protect the power transistor 1110 from burning out. The power transistor 1110 stops drawing the power current IP according to the over-current signal SOC.

According to another embodiment of the invention, when the power transistor 1110 is turned OFF, the control signal SC is in the high logic level to turn ON the low-side transistor 222 to couple the driving node ND to the ground and the high-side transistor 221 is turned OFF.

Meanwhile, the first desaturation normally-off transistor DE1 is turned OFF according to the driving voltage VD being pulled down to the ground and the second desaturation normally-off transistor DE2 is turned ON according to the control signal SC, so that the third desaturation normally-off transistor DE3 is turned ON and the detection node NDT is coupled to the ground. Therefore, the second hysteresis circuit 1132 does not determine whether the detection voltage VDT exceeds the threshold and does not generate the over-current signal SOC.

According to other embodiments of the invention, the control signal SC is generated by a controller, and the controller stops generating the control signal SC according to the over-current signal SOC.

Figure 12:
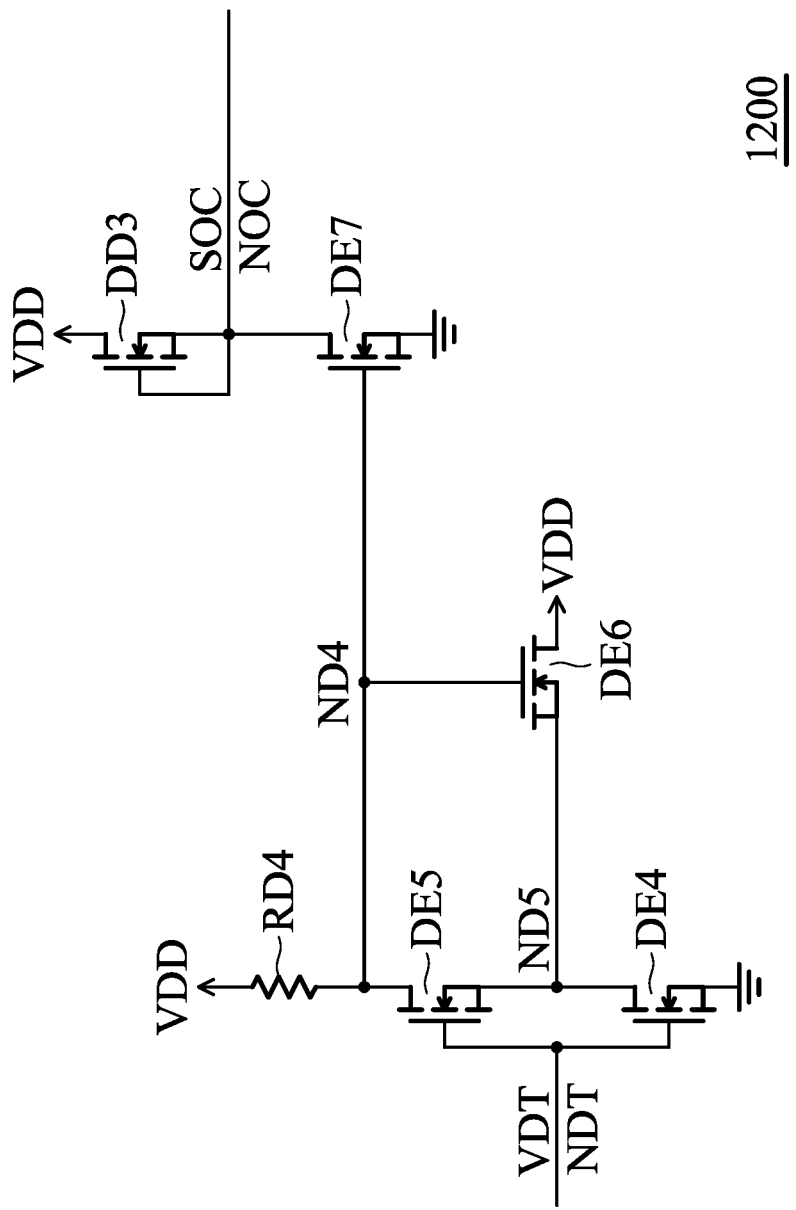
FIG. 12 shows a schematic diagram of the second hysteresis circuit in accordance with an embodiment of the invention.

FIG. 12 shows a schematic diagram of the second hysteresis circuit in accordance with an embodiment of the invention. As shown in FIG. 12, the second hysteresis circuit 1200, which corresponds to the second hysteresis circuit 1132 in FIG. 11, includes a fourth desaturation resistor RD4, a fourth desaturation normally-off transistor DE4, a fifth desaturation normally-off transistor DE5, a sixth desaturation normally-off transistor DE6, a seventh desaturation normally-off transistor DE7, and a third desaturation normally-on transistor DD3.

The fourth desaturation resistor RD4 is coupled between the supply voltage VDD and a fourth desaturation node ND4. The fourth desaturation normally-off transistor DE4 couples a fifth desaturation node ND5 to the ground according to the detection voltage VDT of the detection node NDT. The fifth desaturation normally-off transistor DE5 couples the fourth desaturation node ND4 to the fifth desaturation node ND5 according to the detection voltage VDT.

The sixth desaturation normally-off transistor DE6 supplies the supply voltage VDD to the fifth desaturation node ND5 according to the voltage of the fourth desaturation node ND5. The seventh desaturation normally-off transistor DE7 couples the over-current node NOC to the ground according to the voltage of the fourth desaturation node ND4.

The third desaturation normally-on transistor DD3 includes a gate terminal coupled to the over-current node NOC, a source terminal coupled to the over-current node NOC, and a drain terminal coupled to the supply voltage VDD. According to an embodiment of the invention, the over-current signal VOC is generated on the over-current node NOC.

Figure 13:
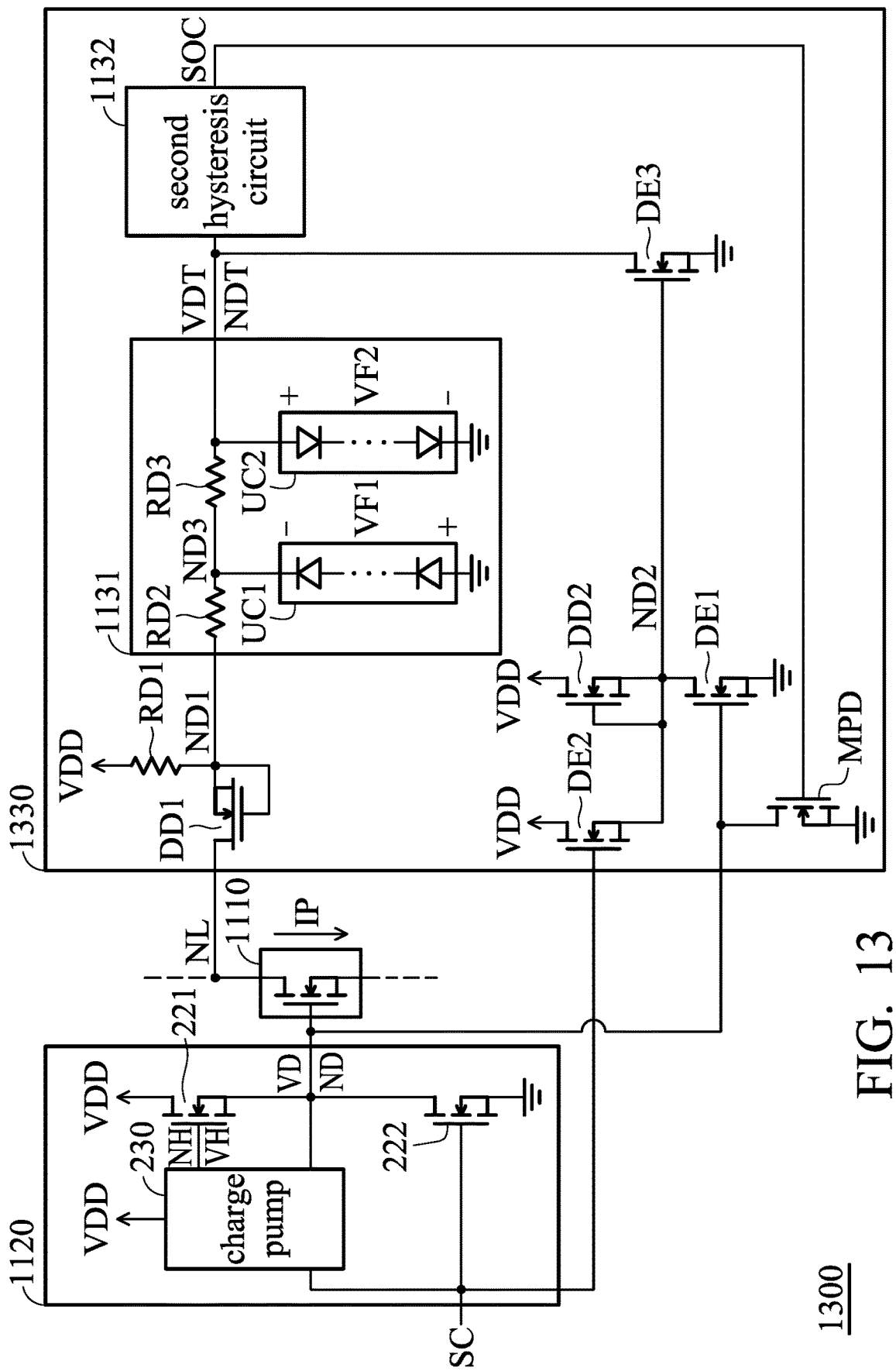
FIG. 13 shows a schematic diagram of a power circuit in accordance with yet another embodiment of the invention.

FIG. 13 shows a schematic diagram of a power circuit in accordance with yet another embodiment of the invention. Comparing the power circuit 1300 to the power circuit 1100 in FIG. 11, the desaturation circuit 1130 in FIG. 11 is replaced with a desaturation circuit 1330. The desaturation circuit 1330 further includes a pull-down transistor MPD.

As shown in FIG. 13, the pull-down transistor MPD pull the driving voltage VD down to the ground in response to the over-current signal SOC. Since the driving voltage VD is pulled down to the ground, the power transistor 1110 is turned OFF. According to other embodiments of the invention, the control signal SC is generated by a controller. The over-current signal SOC may also inform the controller to stop generating the control signal SC for further protecting the power transistor 1110.

Figure 14:
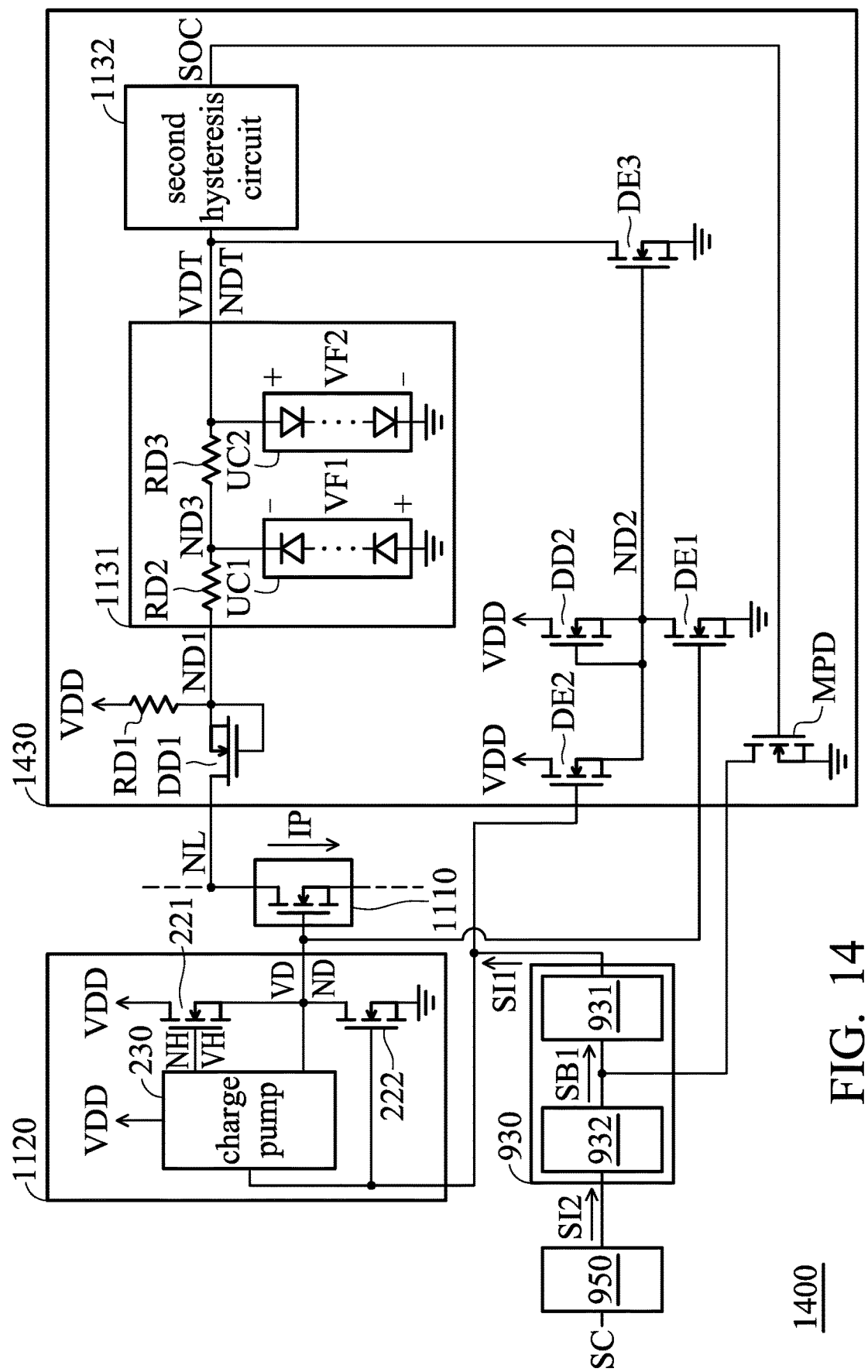
FIG. 14 shows a schematic diagram of a power circuit in accordance with yet another embodiment of the invention.

FIG. 14 shows a schematic diagram of a power circuit in accordance with yet another embodiment of the invention. As shown in FIG. 14, the power circuit 1400 further includes the pre-driver 930 including the first sub pre-driver 931 and the second sub pre-driver 932 and the first hysteresis circuit 950 as illustrated in FIG. 9, which are not repeated herein. Comparing the power circuit 1400 to the power circuit 1100 in FIG. 11, the desaturation circuit 1130 in FIG. 11 is replaced with a desaturation circuit 1430.

The desaturation circuit 1430 further includes a pull-down transistor MPD. As shown in FIG. 14, the pull-down transistor MPD pull the first sub-internal signal SB1 down to the ground in response to the over-current signal SOC such that the power transistor 1110 is turned OFF. According to other embodiments of the invention, the control signal SC is generated by a controller. The over-current signal SOC may also inform the controller to stop generating the control signal SC for further protecting the power transistor 1110.

Figure 15:
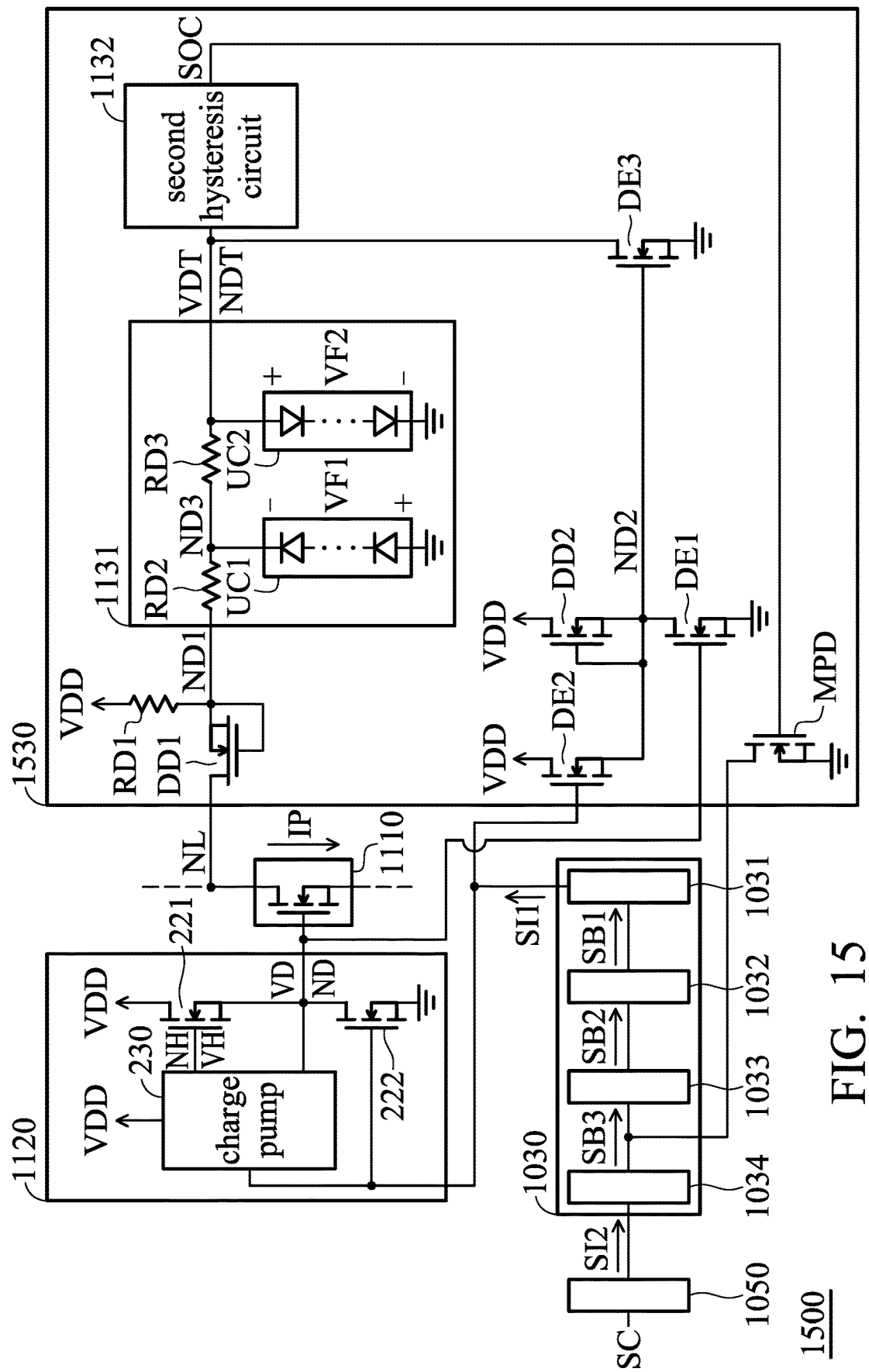
FIG. 15 shows a schematic diagram of a power circuit in accordance with yet another embodiment of the invention.

FIG. 15 shows a schematic diagram of a power circuit in accordance with yet another embodiment of the invention. As shown in FIG. 15, the power circuit 1500 further includes the pre-driver 1030 including the first sub pre-driver 1031, the second sub pre-driver 1032, the third sub pre-driver 1033, and the fourth sub pre-driver 1034 and the first hysteresis circuit 1050 as illustrated in FIG. 10, which are not repeated herein. Comparing the power circuit 1500 to the power circuit 1100 in FIG. 11, the desaturation circuit 1130 in FIG. 11 is replaced with a desaturation circuit 1530.

The desaturation circuit 1530 further includes a pull-down transistor MPD. As shown in FIG. 15, the pull-down transistor MPD pull the third sub-internal signal SB3 down to the ground in response to the over-current signal SOC such that the power transistor 1110 is turned OFF. According to other embodiments of the invention, the control signal SC is generated by a controller. The over-current signal SOC may also inform the controller to stop generating the control signal SC for further protecting the power transistor 1110.

Figure 16:
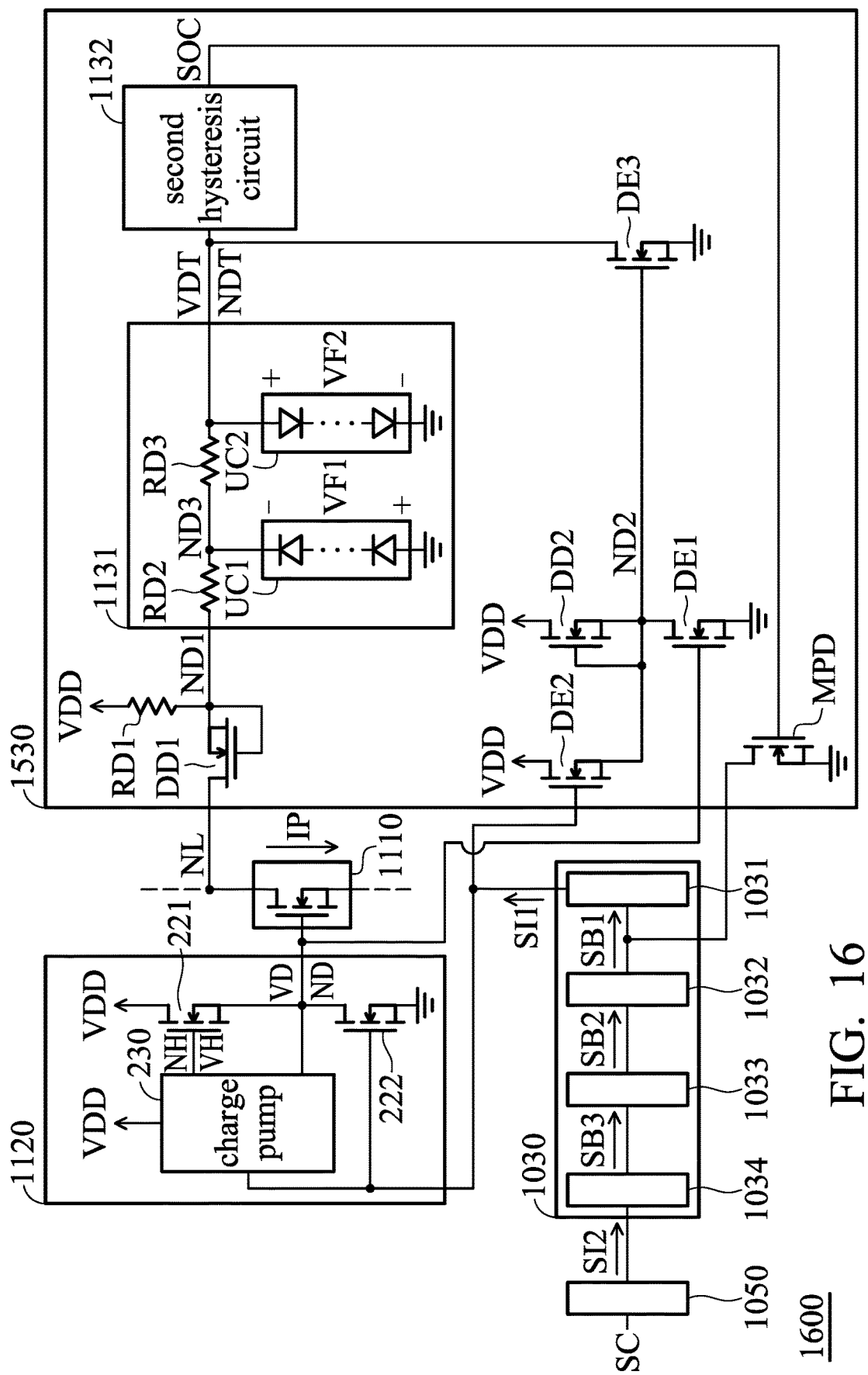
FIG. 16 shows a schematic diagram of a power circuit in accordance with yet another embodiment of the invention.

FIG. 16 shows a schematic diagram of a power circuit in accordance with yet another embodiment of the invention. comparing the power circuit 1600 to the power circuit 1500 in FIG. 15, the pull-down transistor MPD is configured to pull the first sub-internal signal SB1, instead of the third sub-internal signal SB3, down to the ground in response to the over-current signal SOC for protecting the power transistor 1110.

Since the first sub-internal signal SB1 and the third sub-internal signal SB3 are in-phase, either the first sub-internal signal SB1 or the third sub-internal signal SB3 in the low logic level could turn OFF the power transistor 1110. According to an embodiment of the invention, since the dimension of the fifth sub normally-off transistor E5 in the third sub pre-driver 1033 is less than that of the first sub normally-off transistor E1, pulling the third sub-internal signal SB3 down to the ground could be easier and more effective than the first sub-internal signal SB1.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A power circuit, comprising:
   a power transistor, drawing a power current from a loading node according to a driving voltage of a driving node and stopping drawing the power current according to an over-current signal; and
   a driving circuit, comprising:
      a high-side transistor, providing a supply voltage to the driving node according to a high-side voltage of a high-side node;
      a low-side transistor, coupling the driving node to a ground according to a first internal signal;
      a charge pump, coupled to the high-side node and the driving node, wherein the charge pump is configured to generate the high-side voltage that exceeds the supply voltage according to the first internal signal;
      a pre-driver, generating the first internal signal according to a control signal, wherein the pre-driver is configured to improve driving capability of the control signal; and
      a desaturation circuit, determining that the power current exceeds a threshold to generate the over-current signal.

2. The power circuit of claim 1, further comprising:
   a first hysteresis circuit, coupled between the control signal and the pre-driver, wherein the first hysteresis circuit receives the control signal to generate a second internal signal, so that the pre-driver generates the first internal signal according to the second internal signal, wherein the first hysteresis circuit is configured to provide a hysteresis for the control signal.

3. The power circuit of claim 1, wherein the desaturation circuit comprises:
   a first desaturation resistor, coupled between the supply voltage and a first desaturation node;
   a first desaturation normally-on transistor, comprising a gate terminal coupled to the first desaturation node, a source terminal coupled to the first desaturation node, and a drain terminal coupled to the loading node;
   a second desaturation normally-on transistor, comprising a gate terminal coupled to a second desaturation node, a source terminal coupled to the second desaturation node, and a drain terminal coupled to the supply voltage;
   a low-pass filter, filtering out a ripple at the first desaturation node to generate a detection voltage at a detection node;
   a first desaturation normally-off transistor, comprising a gate terminal coupled to the driving node, a source terminal coupled to the ground, and a drain terminal coupled to the second desaturation node;
   a second desaturation normally-off transistor, supplying the supply voltage to the second desaturation node according to the first internal signal;
   a third desaturation normally-off transistor, coupling the detection node to the ground according to a voltage of the second desaturation node; and
   a second hysteresis circuit, determining whether the detection voltage exceeds the threshold and generating the over-current signal when the detection voltage exceeds the threshold.

4. The power circuit of claim 3, wherein the low-pass filter comprises:
   a second desaturation resistor, coupled between the first desaturation node and a third desaturation node;
   a first desaturation unidirectional conducting device, having a first forward voltage, wherein the first desaturation unidirectional conducting device is turned ON when the ripple is lower than the ground by the first forward voltage;
   a third desaturation resistor, coupled between the third desaturation node and the detection node; and
   a second desaturation unidirectional conducting device, having a second forward voltage, wherein the second desaturation unidirectional conducting device is turned ON when the ripple exceeds the second forward voltage.

5. The power circuit of claim 3, wherein the second hysteresis circuit comprises:
   a fourth desaturation resistor, coupled between the supply voltage and a fourth desaturation node;
   a fourth desaturation normally-off transistor, coupling a fifth desaturation node to the ground according to the detection voltage;
   a fifth desaturation normally-off transistor, coupling the fourth desaturation node to the fifth desaturation node according to the detection voltage;
   a sixth desaturation normally-off transistor, supplying the supply voltage to the fifth desaturation node according to a voltage of the fourth desaturation node;
   a seventh desaturation normally-off transistor, coupling an over-current node to the ground according to the voltage of the fourth desaturation node; and
   a third desaturation normally-on transistor, comprising a gate terminal coupled to the over-current node, a source terminal coupled to the over-current node, and a drain terminal coupled to the supply voltage, wherein the over-current signal is generated on the over-current node.

6. The power circuit of claim 5, wherein the desaturation circuit further comprises:
   a pull-down transistor, coupling the driving node to the ground in response to the over-current signal.

7. The power circuit of claim 5, wherein the desaturation circuit further comprises:
   a pull-down transistor, pulling the first sub-internal signal down to the ground in response to the over-current signal.

8. The power circuit of claim 5, wherein the desaturation circuit further comprises:

a pull-down transistor, pulling the third sub-internal signal down to the ground in response to the over-current signal.

9. The power circuit of claim 5, wherein the control signal is generated by a controller, wherein the controller stops generating the control signal in response to the over-current signal.

10. The power circuit of claim 1, wherein the driving circuit further comprises:
a high-side normally-on transistor, comprising a source terminal coupled to the driving node, a gate terminal coupled to the driving node, and a drain terminal supplied by the supply voltage, wherein the high-side normally-on transistor is configured to improve driving capability of the high-side transistor.

11. A driving circuit for driving a power transistor, wherein the power transistor draws a power current according to a driving voltage of a driving node, the driving circuit comprising:
a high-side transistor, providing a supply voltage to the driving node according to a high-side voltage of a high-side node;
a low-side transistor, coupling the driving node to a ground according to a first internal signal;
a charge pump, coupled to the high-side node and the driving node, wherein the charge pump is configured to generate a high-side voltage that exceeds the supply voltage according to the first internal signal;
a pre-driver, generating the first internal signal according to a control signal, wherein the pre-driver is configured to improve driving capability of the control signal, wherein the pre-driver stops generating the first internal signal according to an over-current signal; and
a desaturation circuit, determining that the power current exceeds a threshold to generate the over-current signal, wherein the power transistor stops drawing the power current according to the over-current signal.

12. The driving circuit of claim 11, further comprising:
a first hysteresis circuit, coupled between the control signal and the pre-driver, wherein the first hysteresis circuit receives the control signal to generate a second internal signal, so that the pre-driver generates the first internal signal according to the second internal signal, wherein the first hysteresis circuit is configured to provide a hysteresis for the control signal.

13. The driving circuit of claim 12, wherein the desaturation circuit comprises:
a first desaturation resistor, coupled between the supply voltage and a first desaturation node;
a first desaturation normally-on transistor, comprising a gate terminal coupled to the first desaturation node, a source terminal coupled to the first desaturation node, and a drain terminal coupled to a loading node;
a second desaturation normally-on transistor, comprising a gate terminal coupled to a second desaturation node, a source terminal coupled to the second desaturation node, and a drain terminal coupled to the supply voltage;
a low-pass filter, filtering out a ripple at the first desaturation node to generate a detection voltage at a detection node;
a first desaturation normally-off transistor, comprising a gate terminal coupled to the driving node, a source terminal coupled to the ground, and a drain terminal coupled to the second desaturation node;
a second desaturation normally-off transistor, supplying the supply voltage to the second desaturation node according to the first internal signal;
a third desaturation normally-off transistor, coupling the detection node to the ground according to a voltage of the second desaturation node; and
a second hysteresis circuit, determining whether the detection voltage exceeds the threshold and generating an over-current signal when the detection voltage exceeds the threshold.

14. The driving circuit of claim 13, wherein the low-pass filter comprises:
a second desaturation resistor, coupled between the first desaturation node and a third desaturation node;
a first desaturation unidirectional conducting device, having a first forward voltage, wherein the first desaturation unidirectional conducting device is turned ON when the ripple is lower than the ground by the first forward voltage;
a third desaturation resistor, coupled between the third desaturation node and the detection node; and
a second desaturation unidirectional conducting device, having a second forward voltage, wherein the second desaturation unidirectional conducting device is turned ON when the ripple exceeds the second forward voltage.

15. The driving circuit of claim 13, wherein the second hysteresis circuit comprises:
a fourth desaturation resistor, coupled between the supply voltage and a fourth desaturation node;
a fourth desaturation normally-off transistor, coupling a fifth desaturation node to the ground according to the detection voltage;
a fifth desaturation normally-off transistor, coupling the fourth desaturation node to the fifth desaturation node according to the detection voltage;
a sixth desaturation normally-off transistor, supplying the supply voltage to the fifth desaturation node according to a voltage of the fourth desaturation node;
a seventh desaturation normally-off transistor, coupling an over-current node to the ground according to the voltage of the fourth desaturation node; and
a third desaturation normally-on transistor, comprising a gate terminal coupled to the over-current node, a source terminal coupled to the over-current node, and a drain terminal coupled to the supply voltage, wherein the over-current signal is generated on the over-current node.

16. The driving circuit of claim 15, wherein the desaturation circuit further comprises:
a pull-down transistor, coupling the driving node to the ground in response to the over-current signal.

17. The driving circuit of claim 15, wherein the desaturation circuit further comprises:
a pull-down transistor, pulling the first sub-internal signal down to the ground in response to the over-current signal.

18. The driving circuit of claim 15, wherein the desaturation circuit further comprises:
a pull-down transistor, pulling the third sub-internal signal down to the ground in response to the over-current signal.

19. The driving circuit of claim 15, wherein the control signal is generated by a controller, wherein the controller stops generating the control signal in response to the over-current signal.

20. The driving circuit of claim 11, wherein the driving circuit further comprises:
- a high-side normally-on transistor, comprising a source terminal coupled to the driving node, a gate terminal coupled to the driving node, and a drain terminal supplied by the supply voltage, wherein the high-side normally-on transistor is configured to improve driving capability of the high-side transistor.

* * * * *